(12) United States Patent
Toda

(10) Patent No.: US 7,859,885 B2
(45) Date of Patent: Dec. 28, 2010

(54) PHASE CHANGING MEMORY DEVICE

(75) Inventor: Haruki Toda, Yokohami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 11/970,154

(22) Filed: Jan. 7, 2008

(65) Prior Publication Data
US 2008/0112211 A1    May 15, 2008

Related U.S. Application Data

(62) Division of application No. 10/548,575, filed as application No. PCT/JP03/03256 on Mar. 18, 2003, now abandoned.

(51) Int. Cl.
*G11C 11/00* (2006.01)

(52) U.S. Cl. .................. 365/148; 365/100; 365/105; 365/52; 365/158; 365/171; 365/175; 365/72

(58) Field of Classification Search .......... 365/148, 365/100, 105, 52, 158, 171, 175, 72
See application file for complete search history.

(56) References Cited

U.S. PATENT DOCUMENTS

| | | | |
|---|---|---|---|
| 5,237,529 A * | 8/1993 | Spitzer ..................... | 365/158 |
| 5,406,509 A | 4/1995 | Ovshinsky et al. | |
| 5,699,293 A * | 12/1997 | Tehrani et al. ............. | 365/158 |
| 5,818,749 A | 10/1998 | Harshfield | |
| 5,969,380 A * | 10/1999 | Seyyedy ..................... | 257/295 |
| 6,034,882 A | 3/2000 | Johnson et al. | |
| 6,133,085 A | 10/2000 | Linliu | |
| 6,141,241 A | 10/2000 | Ovshinsky et al. | |
| 6,191,972 B1 * | 2/2001 | Miura et al. ................ | 365/171 |
| 6,191,989 B1 * | 2/2001 | Luk et al. ................... | 365/207 |
| 6,339,544 B1 | 1/2002 | Chiang et al. | |
| 6,392,913 B1 | 5/2002 | Sandhu | |
| 6,501,111 B1 | 12/2002 | Lowrey | |
| 6,545,898 B1 * | 4/2003 | Scheuerlein ................ | 365/94 |
| 6,549,447 B1 | 4/2003 | Fricke et al. | |
| 6,594,171 B1 * | 7/2003 | Hogan ........................ | 365/52 |
| 6,611,455 B2 * | 8/2003 | Sekiguchi et al. .......... | 365/171 |
| 6,754,097 B2 * | 6/2004 | Sharma et al. .............. | 365/158 |
| 6,778,421 B2 * | 8/2004 | Tran .......................... | 365/105 |
| 6,781,874 B2 * | 8/2004 | Hidaka ....................... | 365/171 |
| 6,791,859 B2 * | 9/2004 | Hush et al. ................. | 365/100 |

(Continued)

FOREIGN PATENT DOCUMENTS

JP    2002-260377    9/2002

(Continued)

*Primary Examiner*—Viet Q Nguyen
(74) *Attorney, Agent, or Firm*—Oblon, Spivak, McClelland, Maier & Neustadt, L.L.P.

(57) ABSTRACT

A phase change memory device includes a substrate, a plurality of cell arrays stacked above the substrate and each including a matrix layout of a plurality of memory cells, each the memory cell storing therein as data a resistance value determinable by a phase change, a write circuit configured to write a pair cell constituted by two neighboring memory cells within the plurality of cell arrays in such a manner as to write one of the pair cell into a high resistance value state and write the other into a low resistance value state, and a read circuit configured to read complementary resistance value states of the pair cell as a one bit of data.

47 Claims, 26 Drawing Sheets

U.S. PATENT DOCUMENTS

| | | | |
|---|---|---|---|
| 6,813,182 B2 * | 11/2004 | Perlov et al. | 365/175 |
| 6,822,897 B2 * | 11/2004 | Ishikawa | 365/171 |
| 6,879,508 B2 * | 4/2005 | Tran | 365/100 |
| 7,335,906 B2 * | 2/2008 | Toda | 257/2 |
| 7,394,680 B2 * | 7/2008 | Toda et al. | 365/148 |
| 7,400,522 B2 * | 7/2008 | Toda et al. | 365/148 |
| 7,459,715 B2 * | 12/2008 | Toda et al. | 257/2 |
| 7,459,716 B2 * | 12/2008 | Toda et al. | 257/2 |
| 7,535,748 B2 * | 5/2009 | Shirahama et al. | 365/148 |
| 7,606,059 B2 * | 10/2009 | Toda | 365/148 |
| 7,706,167 B2 * | 4/2010 | Toda et al. | 365/148 |
| 2002/0136047 A1 | 9/2002 | Scheuerlein | |
| 2004/0184331 A1 | 9/2004 | Hanzawa et al. | |

FOREIGN PATENT DOCUMENTS

| | | |
|---|---|---|
| JP | 2002-530850 | 9/2002 |
| JP | 2002-541613 | 12/2002 |
| WO | WO 00/30118 | 5/2000 |
| WO | WO 00/62301 | 10/2000 |
| WO | WO 03/065377 A1 | 8/2003 |

* cited by examiner

1st EXPOSURE

2nd EXPOSURE

PROCESS

PHASE CHANGING MEMORY DEVICE

CROSS-REFERENCE TO RELATED APPLICATIONS

The present application is a division of U.S. patent application Ser. No. 10/548,575, filed on Feb. 6, 2006, which is the National Stage of PCT/JP03/03256, filed on Mar. 18, 2003, the entire contents of which are incorporated herein by reference.

TECHNICAL FIELD

This invention relates to electrically rewritable phase change memory devices which store therein a resistance value determinable by a phase change between crystalline and amorphous states of memory material in a non-volatile manner.

BACKGROUND ART

EEPROM flash memories are known in the prior art as large-capacity multifunctional nonvolatile semiconductor memories. In this type of semiconductor memories, microfabricated ultra-fine circuitry of less than 100 nm has been achieved on a flat surface or plane due to recent advances in lithography technologies and etching techniques. As far as considerations on the plane are concerned, it is a must for enlargement of the memory capacity to further advance microfabrication or miniaturization in order to increase a cell number per unit area. However, such further miniaturization is not easy.

In order to increase the memory capacity without advancing the miniaturization, there is employed a method for sealing a plurality of stacked memory chips together into a package or alternatively a method of stacking or laminating memory cell arrays on or above silicon to thereby provide a three-dimensional memory chip. However, the conventionally conceived cell array stacking techniques are to simply overlie planar cell arrays. In this case, although if the number of such stacked or laminated layers is N then the resultant storage capacity is N times greater than a planar cell array, accessing is done separately in units of respective layers; thus, simultaneous access to a plurality of layers has not been easily achievable.

On the other hand, a phase change memory has been proposed which is expected as a nonvolatile memory for the future use and which utilizes a phase transition between crystalline and amorphous states in chalcogenide glass material (for example, see Jpn. J. Appl. Phys. Vol. 39 (2000) PP. 6157-6161 Part 1. No. 11, November 2000 "Submicron Nonvolatile Memory Cell Based on Reversible Phase Transition in Chalcogenide Glasses" Kazuya Nakayama et al). This utilizes the fact that the chalcogenide's resistance ratio of its amorphous state to crystalline state is as large as 100:1 or greater and stores therein such different resistance value states as binary data. The chalcogenide's phase change is reversible, wherein such change is well controllable by an appropriate heating technique or method, which in turn is controllable by the amount of a current flowing in this material.

In the case of designing such a phase change memory in ultra-large scale, unwanted variations or irregularities in distributions of low resistance values and high resistance values of memory cells within a cell array become larger so that how to provide the required read/write margins becomes an important technical issue.

DISCLOSURE OF INVENTION

A phase change memory device in accordance with one embodiment of the invention includes a substrate, a plurality of cell arrays stacked above the substrate and each including a matrix layout of a plurality of memory cells, each the memory cell storing therein as data a resistance value determinable by a phase change, a write circuit configured to write a pair cell constituted by two neighboring memory cells within the plurality of cell arrays in such a manner as to write one of the pair cell into a high resistance value state and write the other into a low resistance value state, and a read circuit configured to read complementary resistance value states of the pair cell as a one bit of data.

EMBODYING MODE

Figure 1:
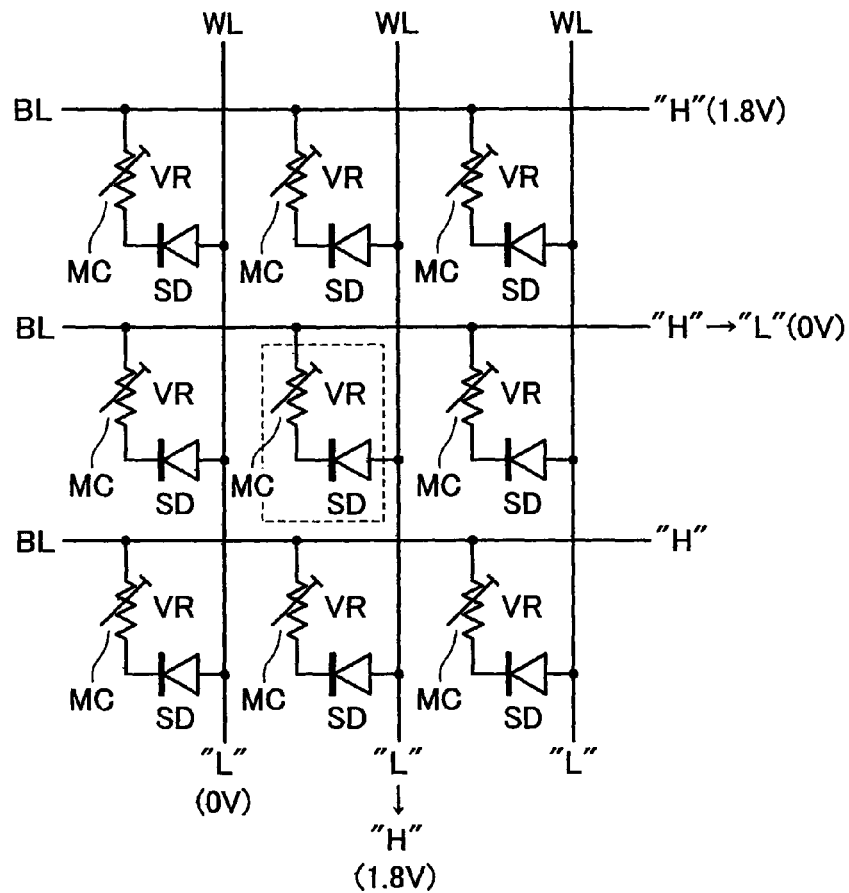
FIG. 1 is a diagram showing an equivalent circuit configuration of a basic cell array in accordance with an embodiment of this invention.

FIG. 1 shows a basic cell array configuration of a phase change memory in accordance with an embodiment, with respect to a 3×3 matrix portion thereof. A plurality of first wiring lines (hereinafter, referred to as "bit lines") BL are provided and disposed in parallel; a plurality of second wiring lines (referred to hereinafter as "word lines") WL are provided and arranged in such a manner as to cross or intersect them. Memory cells MC are laid out at respective crossing points or intersections of these word lines WL and bit lines BL. A memory cell MC is a series connection circuit of a variable resistive element VR and a diode SD. The variable resistive element VR is made of chalcogenide and stores as binary data in a nonvolatile manner the largeness or smallness of a resistance value due to a phase transition between its crystalline and amorphous states.

Although the diode SD is a Schottky diode in the case of this embodiment, a pn junction diode is alternatively useable. One end of the memory cell MC is connected to a bit line BL; the other end of it is connected to a word line WL. Although in the drawing the diode SD is with the word-line WL side as an anode, the polarity of diode SD may be reversed or alternatively the layout of the variable resistive element VR and diode SD can be made inverse in view of the fact that what is required here is to obtain the cell selectivity based on a potential voltage relationship of the word line WL and bit line BL.

As previously stated, data is stored in the form of a resistance value of the resistive element VR of each memory cell MC. In an unselected or non-select state, all the word lines WL are set at "L" level and all bit lines BL are at "H" level. One example is that "H" level is 1.8 V and "L" level is 0V. In this nonselect state, the diodes SD of all the memory cells MC are in a reverse bias state and thus in an off-state so that no currents flow in any resistive elements VR. Considering the case of selecting a central memory cell MC which is encircled by broken lines in the cell array of FIG. 1, set a presently selected word line WL at "H" while letting a selected bit line BL be at "L." With this setting, at a selected cell, its diode SD becomes forward-biased to cause a current to flow therein.

As the amount of a current flowing in the selected cell at this time is determined by the phase of the chalcogenide which makes up the resistive element VR, detecting whether the current amount is large or small enables achievement of data readout. It is also possible for the chalcogenide of the resistive element VR to generate a phase transition by getting higher the "H" level potential of a selected word line to thereby increase the current amount and by utilizing heat-up of a cell portion due to this current, by way of example. Thus, it is possible to select a specific cell in the cell array and to rewrite the information of such cell.

In this way, in the cell array of this embodiment, accessing is done only by potential level setup of a single word line WL and a single bit line BL. In the case of providing a transistor for cell selection, an extra signal line is required for selection of the gate of such transistor within the cell array; however, in this embodiment, such signal line is not required in any way. Additionally, in view of the fact that the diode is simpler in structure than the transistor, the cell array becomes simpler in configuration due to this feature along with the decreased signal line feature, which in turn makes it possible to achieve higher integration densities of the cells involved.

Regarding the diode SD which is used, for cell selection, a Schottky diode is used therefor in particular whereby many effects are obtainable. Firstly, the Schottky diode is a majority-carrier element unlike pn junction diodes whereby accumulation of minority carriers hardly takes place so that high-speed access becomes possible. Second, both the cell array configuration and the fabrication process become simpler because of the fact that it is unnecessary to form any pn junctions. Third, Schottky junctions remain stable relative to temperatures unlike the pn junctions which inherently suffer from temperature-induced changes or variations in characteristics.

Although in the above operation explanation one specific case was indicated in which the potential levels of a word line WL and bit line BL are controlled to perform resistance value detection (data readout) and phase-change control (data write or data program) of the chalcogenide that makes up the resistive element VR, it is also possible to perform the read and write operations by controlling the levels of currents flowing in the word line WL and bit line BL. These voltage control scheme and current control scheme are different from each other in the significance of energy to be given to the chalcogenide during reading of a resistance value. This is because the chalcogenide is higher in resistance value when it is set in its amorphous state and low in resistance value in the crystalline state thereof. More specifically, if the voltage control is used then power being produced in the chalcogenide becomes equal to $v^2/R$, where R is the resistance of chalcogenide; if the current control is used then the same is defined by $iR^2$. Due to this, the both schemes are different from each other in influenceability of a temperature change of the chalcogenide in the process of resistance detection being given to the phase change. Accordingly, an appropriate one of these schemes may be chosen by taking account of the cell structure and the stability as given to the phase state of the chalcogenide.

So far, the configuration of the basic cell array has been explained. In this embodiment, a three-dimensional (3D) cell array structure with a plurality of cell arrays stacked or laminated on or above a substrate is used. Such 3D cell array structure will be explained below.

Figure 2:
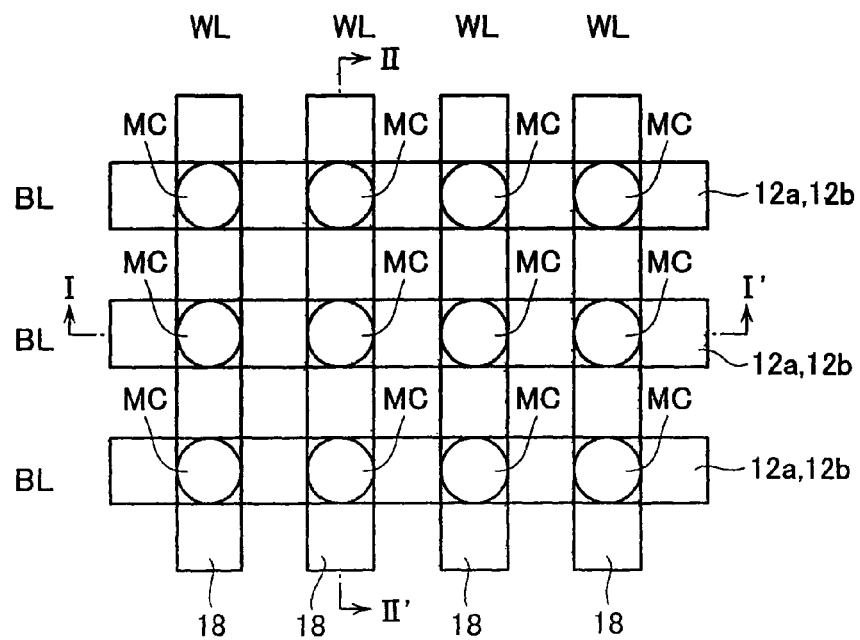
FIG. 2 is a diagram showing a schematic layout of a three-dimensional cell array of an embodiment.
Figure 3:
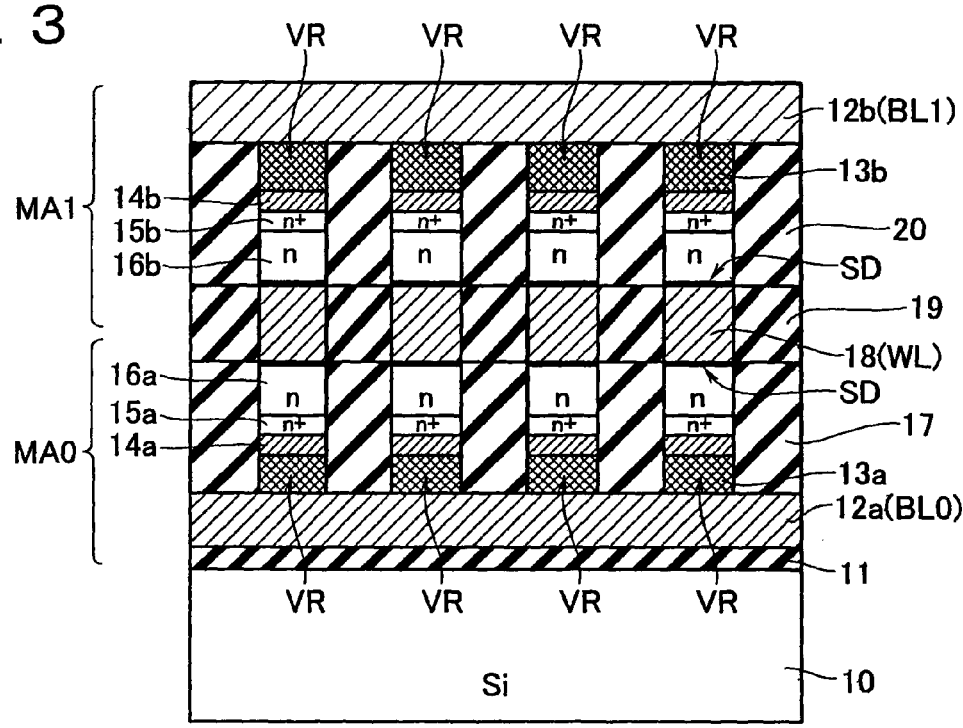
FIG. 3 is an I-I' cross-sectional diagram of FIG. 2 in the case of a two-layer cell array.

FIG. 2 and FIG. 3 show an example with a stacked structure of two cell arrays MA0, MA1, wherein FIG. 2 depicts a schematic layout and FIG. 3 is its I-I' cross-sectional diagram. The same numerals are used at corresponding portions of a lower cell array MA0 and an upper cell array MA1 while distinguishing one from the other by addition of "a" and "b" thereto. A silicon substrate 10 which is covered by a silicon oxide film 11 is used as an insulative dielectric substrate. Firstly, on this substrate, a plurality of mutually parallel bit lines (BL0) 12a are formed and laid out. On these bit lines 12a, column-like memory cells MC are formed and disposed in a spaced-apart manner, wherein each cell consists essentially of a stacked structure of a variable resistive element VR that is comprised of a chalcogenide layer 13a and a Schottky diode SD.

To be more concrete, memory cells MC of the first layer cell array MA0 are formed by patterning of a lamination or multilayer film of the chalcogenide layer 13a, an ohmic electrode 14a, an $n^+$-type silicon layer 15a and an n-type silicon layer 16a. The memory cells MC are pattern-formed into columnar shapes by use of a method as will be explained later. At this stage, the Schottky diodes SD remain unfinished yet—only their main body portions are made. Peripheral portions of the memory cells MC are buried with an interlayer dielectric film 17 and then made flat or "planarized."

And, word lines (WL) 18 are formed which become anode electrodes of the diodes SD and which commonly connect the diodes SD in the direction that crosses the bit lines 12a. A Schottky junction is formed between the word line 18 and the n-type silicon layer 16a, thus obtaining the Schottky diode SD. Optionally, in order to make a more preferable Schottky diode, it is also permissible to form a metal film in addition to the word line 18, which film is in Schottky contact with the n-type silicon layer 16a.

A space between adjacent word lines 18 is filled with a buried interlayer dielectric film 19 and then planarized. And on this film, a second layer cell array MA1 is stacked. More specifically, through patterning of a lamination film of an n-type silicon layer 16b, an $n^+$-type silicon layer 15b, an ohmic electrode 14b and a chalcogenide 13b, column-like memory cells MC are formed each of which is a stacked body of a Schottky diode SD and a variable resistive element VR. The layout of these memory cells MC is the same as that of the first layer cell array MA0. A Schottky junction is formed between a word line 18 and the n-type silicon layer 16b. The periphery of this memory cell MC also is filled with a buried interlayer dielectric film 20 and then planarized. Furthermore, bit lines (BL1) 12b are formed by patterning in such a manner as to commonly connect chalcogenide layers 13b which are aligned or queued in the direction that crosses the word lines 18 at right angles.

In the way stated above, the cell arrays MA0, MA1 are stacked each other while commonly sharing the word lines (WL) 18. Although in FIG. 3 an example is shown wherein the cell arrays MA0, MA1 are opposite to each other in the lamination order of the Schottky diode SD and resistive element VR, the same lamination order may alternatively be used. Additionally the lamination order of resistive element VR and diode SD may also be reversed within each cell array MA0, MA1. In brief, as far as the scheme for accessing while setting a selected word line WL at "H" level and a selected bit line BL at "L" level is employed, the lamination order of diode SD and resistive element VR per se is not so important if the diode SD is disposed to have its polarity with the word line WL side as an anode in both of the upper and lower cell arrays.

Figure 4:
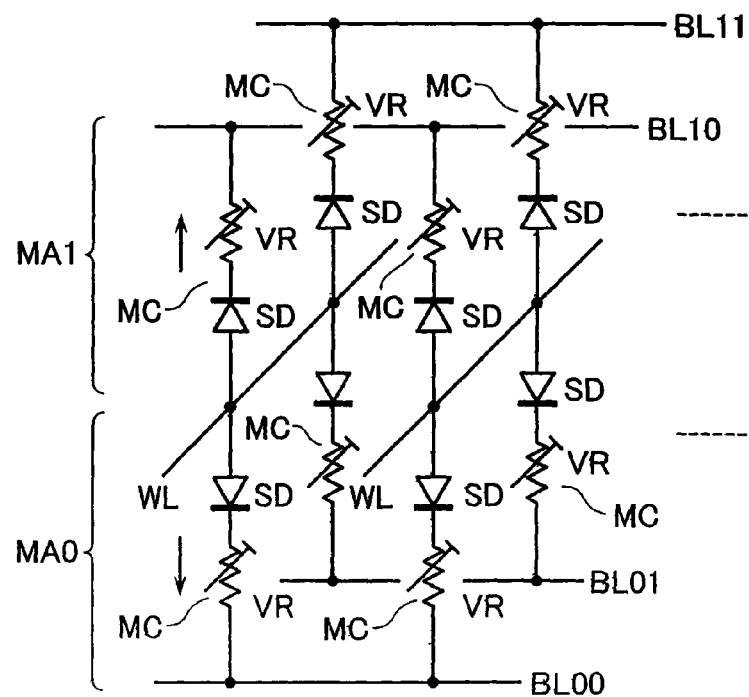
FIG. 4 is an equivalent circuit of the three-dimensional cell array.

FIG. 4 shows, in equivalent circuit form, the stacked layer structure of the cell arrays MA0, MA1 thus arranged in this way. Although this invention makes use of such stacked cell arrays that consist of at least two layers, the invention should not be limited thereto and it is possible to stack a further increased number of layers of cell arrays.

Figure 5:
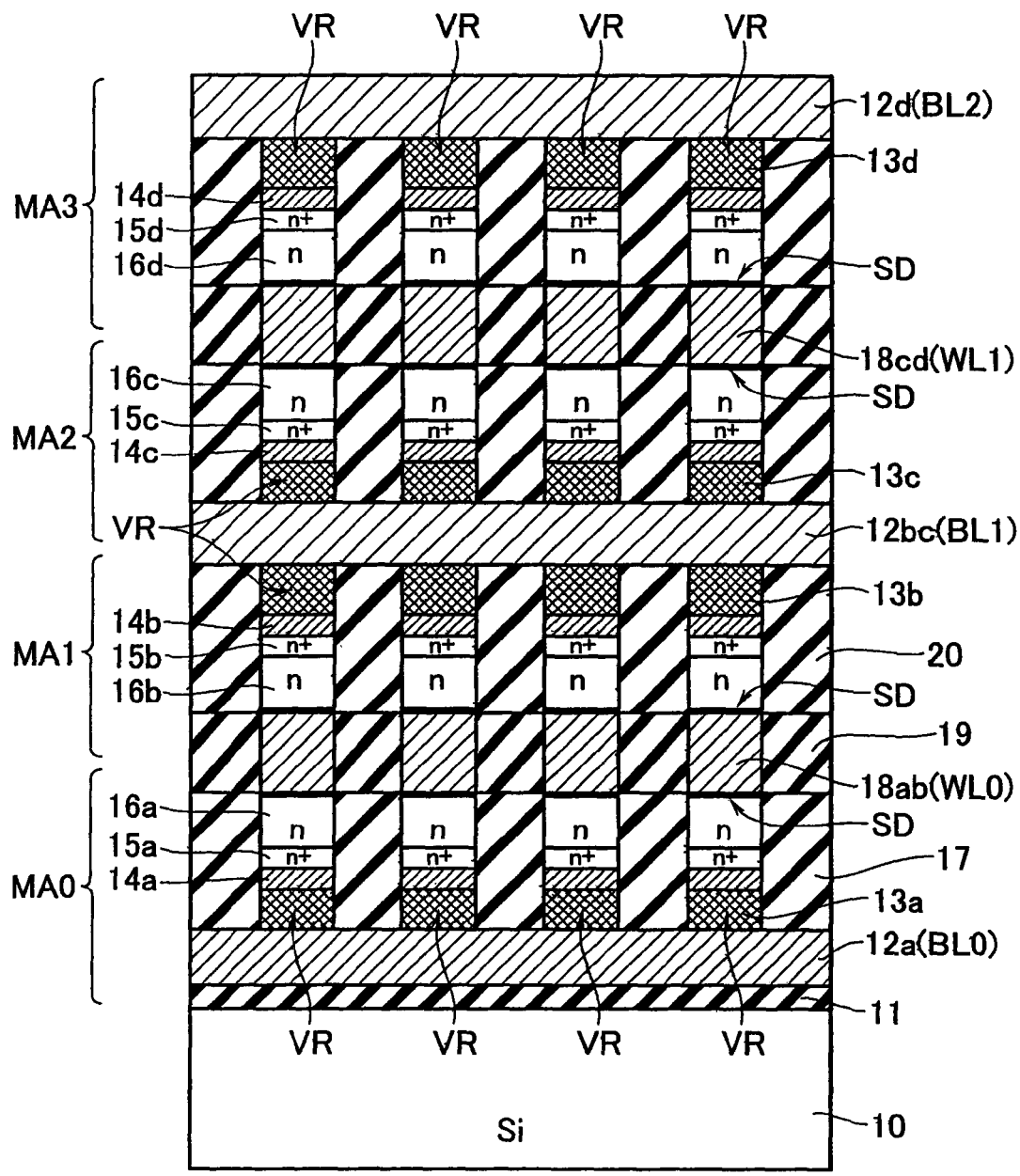
FIG. 5 is an I-I' cross-sectional diagram of FIG. 2 in the case of a four-layer cell array.

FIG. 5 shows a stacked structure of four cell arrays MA0-MA3 as a more preferable example. Corresponding portions of each cell array uses the same numerals with "a," "b," "c" and "d" being added thereto in the order as sequentially counted up from the lowest part. The above-explained stacked structure of the two-layer cell arrays MA0, MA1 is repeated so that a detailed explanation is omitted herein. Word lines (WL0) 18ab are commonly used or shared between the first layer cell array MA0 and the second layer cell array MA1. Bit lines (BL1) 12bc are shared between the second layer cell array MA1 and a third layer cell array MA2. Word lines (WL1) 18cd are shared between the third layer cell array MA2 and a fourth layer cell array MA3. Respective ones of bit lines (BL0) 12a of the lowermost layer cell array MA0 and bit lines (BL2) 12d of the uppermost layer cell array MA3 are prepared independently.

The above-stated three-dimensional cell array is such that the word lines WL and bit lines BL are formed with the line/space=1F/1F, where F is the minimum device-feature size, by way of example. And, in each cell array, a column-like memory cell MC with its chalcogenide and diode stacked over each other is disposed at each cross point or intersection of the word lines WL and bit lines BL.

To achieve further miniaturization in the manufacture of such three-dimensional cell array, it is a must to take into consideration the influenceability of diffraction of electromagnetic waves or the like at exposure steps. In this point of view, whenever an attempt is made to lay out the memory cells at positions distant far from the stripe-shaped word lines and bit lines, it is difficult to optimize the fabrication processes required therefor. In the three-dimensional cell array of this embodiment, the memory cells are placed at respective intersections of the bit lines and word lines in the state that each cell is interposed or "sandwiched" between bit and word lines. In the light of this, when performing resist exposure for memory cell etching purposes, double exposure of stripe-shaped mask patterns for the bit lines and word lines is carried out to thereby enable patterning of highly miniaturized ultrafine memory cells without receiving any possible influence of diffraction or the like. This point will be explained in more detail below.

Figure 6:
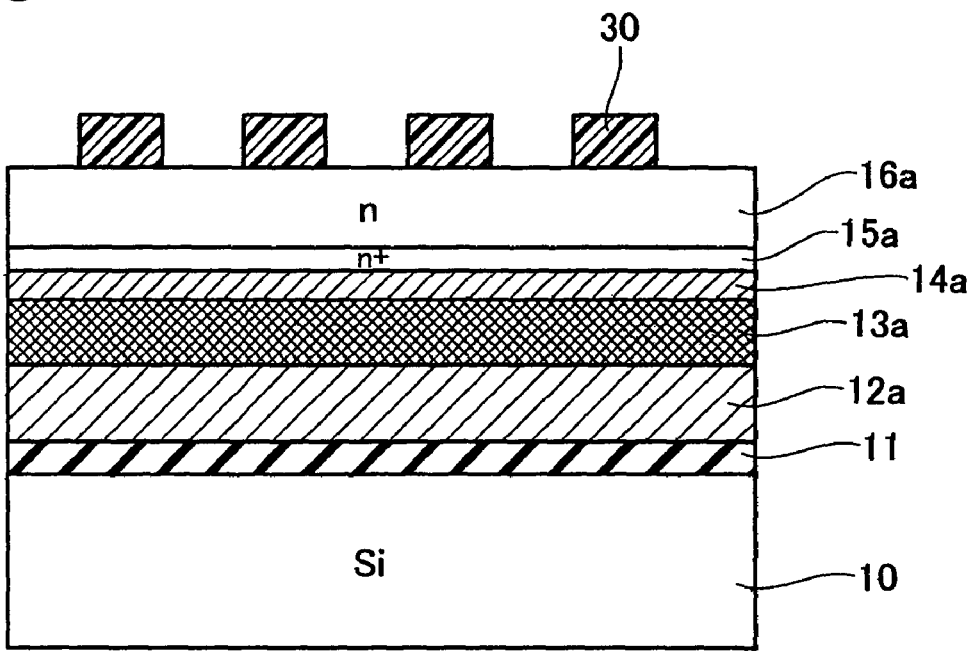
FIG. 6 is a diagram showing a film deposition process step of from a chalcogenide layer up to an n-type silicon layer after having formed bit lines.
Figure 7:
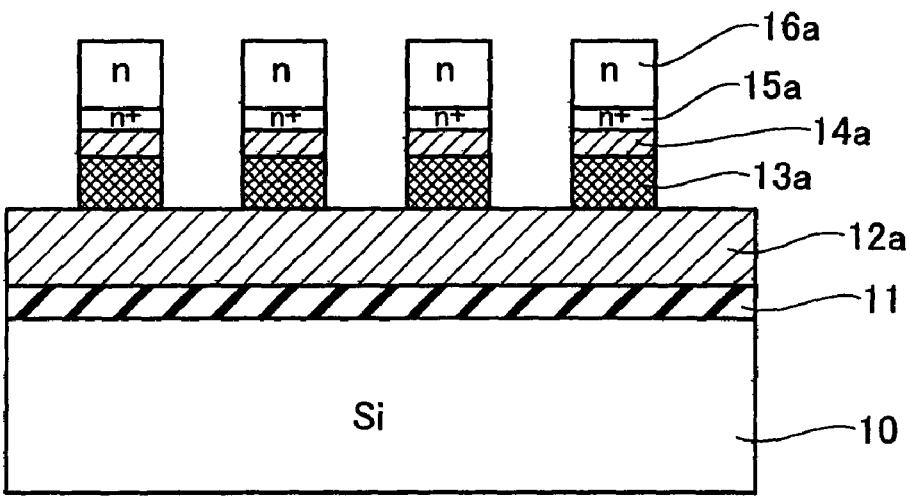
FIG. 7 is a diagram showing a memory cell patterning process step.

FIG. 6 is a state obtained after patterning formation of the bit lines (BL) 12a above a substrate, with a chalcogenide film 13a, ohmic electrode film 14a, $n^+$-type silicon film 15a and n-type silicon film 16a being sequentially stacked thereon. On this multilayer film, a resist 30 with column-like portions is pattern-formed by lithography. And with this resist 30 as a mask, the multilayer film is etched to form lamination film-based columnar memory cells (note here that these are unfinished yet at this stage) which are disposed over the bit lines 12a in such a manner that adjacent ones are spaced apart from each other as shown in FIG. 7. Thereafter, as has been shown in FIG. 3, marginal spaces of the columnar memory cells are filled with a buried dielectric film 17; then, form word lines 18 which function also as the anode electrodes of diodes, thus completing the first layer cell array MA0.

Figure 8A:
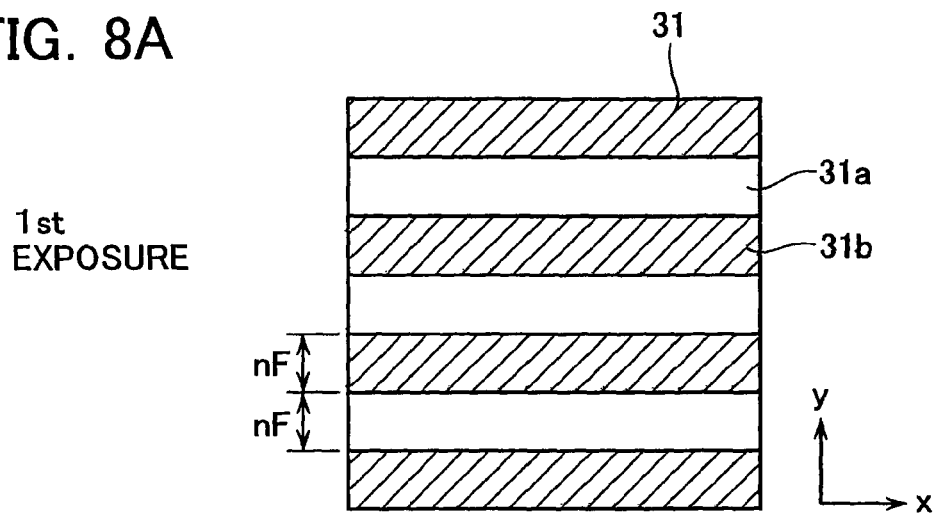
FIGS. 8A-8C are diagrams for explanation of a lithography process for memory cell patterning.
Figure 8B:
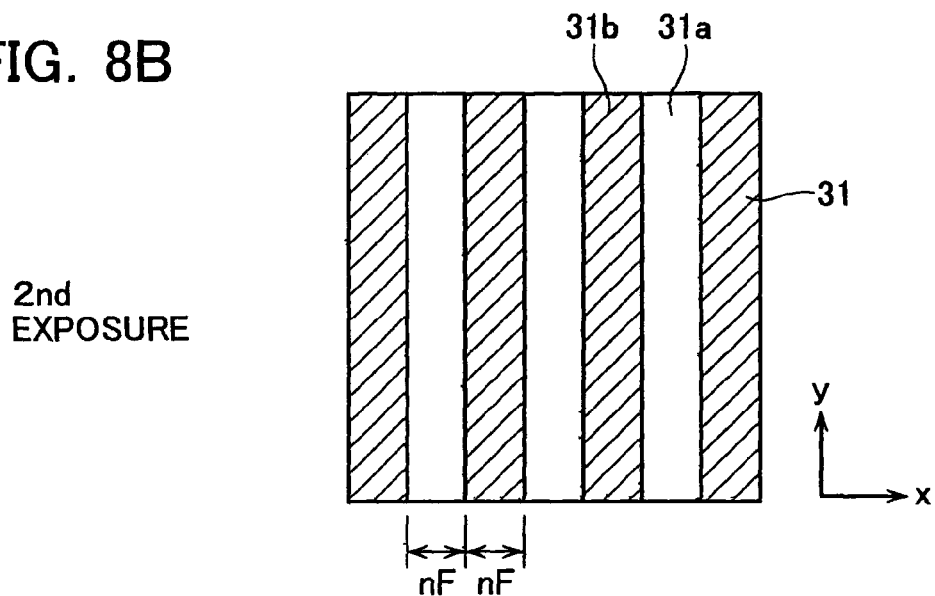
Figure 8C:
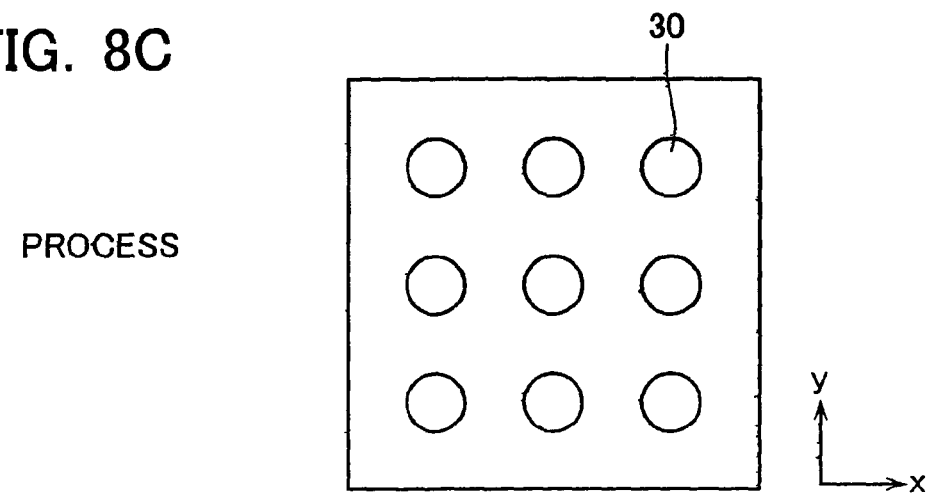

For the patterning of the laminated films such as shown in FIG. 7, a double exposure technique of the resist is utilized. Its lithography process will be explained in detail by use of FIGS. 8A-8C. After having formed the lamination film structure of FIG. 6, deposit a resist 30 on the entire surface area of the n-type silicon film 16a; then, the first resist exposure is performed using an exposure mask 31 shown in FIG. 8A. The exposure mask 31 is the one in which long opening portions 31a and light shielding portions 31b extending in an "x" direction (in the direction along the bit lines) are alternately arranged in a "y" direction. This exposure mask 31 is the same one as that used for patterning of the bit lines (BL) 12a so that exposure is done with the pattern overlapping the bit lines 12a. Subsequently, let the same exposure mask 31 rotate by 90.degree.; then, perform the second exposure in a way as shown in FIG. 8B. This is the same as that used for patterning of the word lines (WL) 18ab; thus, exposure is to be done with the pattern overlapping the word lines 18ab which will be later formed. Supposing that the resist 30 is made of a photosetting resin (i.e., negative type resist), the resist 30 is such that each crossing portion of such two-time exposure patterns is sufficiently hardened by the double exposure. Accordingly, developing the resist 30 makes it possible to leave an array of dot-shaped resist portions 30 as shown in FIG. 8C. With this resist 30 as a mask, etch the laminated films to thereby enable formation of the columnar ultrafine or "micro" memory cells stated previously.

By repeating such lithography and etching processes with respect to each cell array, a three-dimensional cell array with memory cells disposed at the same positions of each cell array is obtained. As shown in FIGS. 8A and 8B, if reduced-size exposure of 1/n is performed with the width of the opening 31a and light shield portion 31b of the exposure mask 31 being set at n×F (F: minimum device-feature size), the resulting bit lines BL and word lines WL become the line/space=1F/1F. In this case, the unit cell area of each cell array becomes equal to $4F^2$.

As described above, when the resist 30 is of negative type, double exposure portions, which are exposed at twice by two exposure steps, are remained as etching masks. In contrast to this, positive type resist may also be employed. When such the resist is used, it is required to perform two exposure steps as similar to the above-described exampled by use of an inverse exposure mask that has a pattern inverted to the above-described exposure mask 31. In this case, non-exposed portions of the resist during the two exposure steps are remained as etching masks as similar to the above-described example.

While the three-dimensional cell array of this embodiment enables realization of a large storage capacity of memory, it is preferable when performing data processing to receive certain considerations as to the accessing of the three-dimensional cell array. More definitely, arrange three-dimensional cell blocks that are preferable for use during data search or else.

Figure 9:
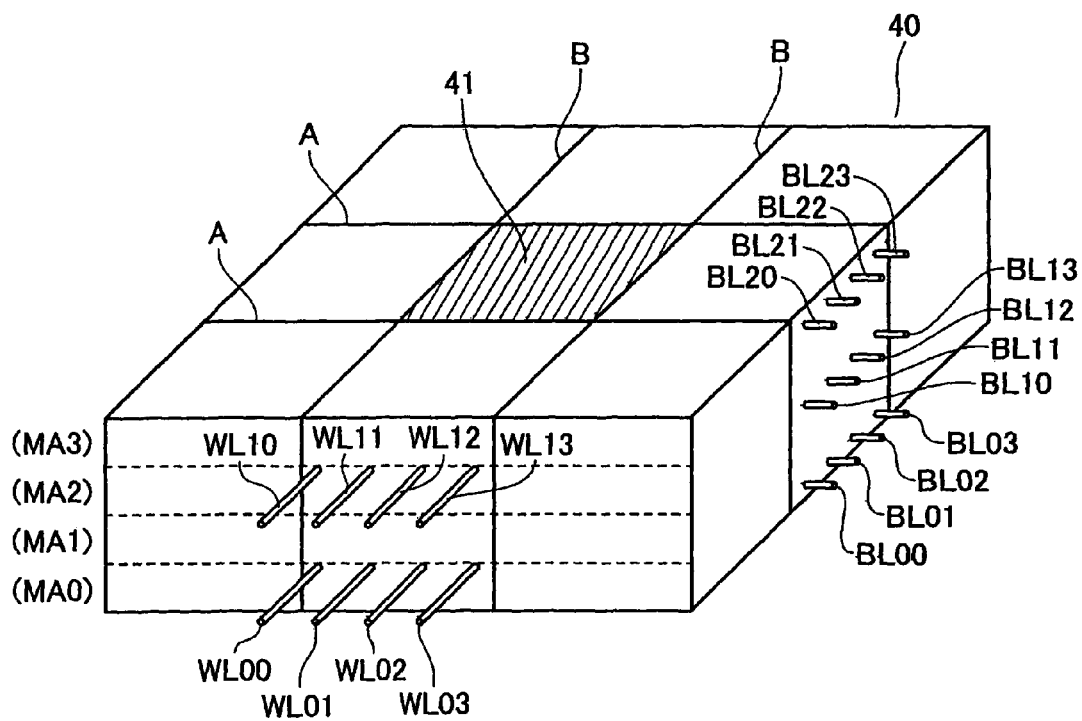
FIG. 9 is a diagram showing a cell block arrangement method of a four-layer cell array.

FIG. 9 shows a setting method of cell blocks for use as the units of data access, with respect to a three-dimensional cell array 40 of the MA0-MA3 shown in FIG. 3. In FIG. 9, the three-dimensional cell array 40 is indicated as a rectangular solid body, wherein this cell array 40 is such that a plurality of cell blocks 41 are partitioned on its upper surface by imaginary or virtual boundary lines A, B which perpendicularly cross at right angles each other. Here, an example is shown in which a single cell block 41 is defined as a rectangular solid body that includes twelve bit lines within a range as interposed by virtual boundaries A with constant intervals extending in parallel to the bit lines BL and also includes eight word lines within a range as interposed by virtual boundaries B with fixed intervals in parallel to the word lines WL. Thus the cell block 41 becomes a three-dimensional assembly of 4×4×4=64 cells.

In FIG. 9, the bit lines BL and word lines WL are shown only with respect to a single cell block 41, which is indicated by oblique lines. BL00 to BL03 are bit lines of the first layer cell array MA0; BL10-BL13 are shared bit lines of the second layer cell array MA1 and the third layer cell array MA2; and, BL20-BL23 are bit lines of the fourth layer cell array MA3. WL00-WL03 are shared word lines of the first layer cell array MA0 and second layer cell array MA1; WL10-WL13 are shared word lines of the third layer cell array MA2 and fourth cell array MA3.

Figure 10:
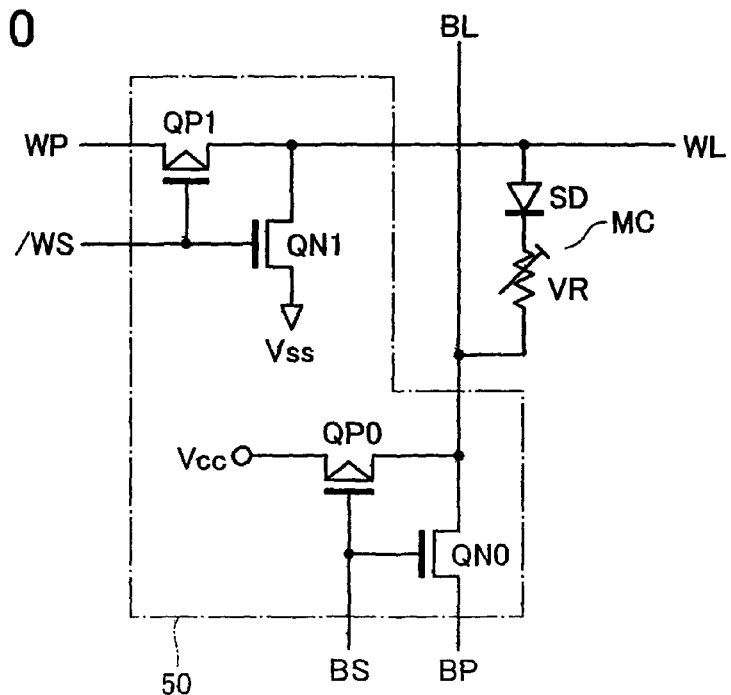
FIG. 10 is a diagram showing a basic configuration of a selector circuit which selects a bit line and word line of a cell array.

FIG. 10 shows an exemplary configuration of a basic selector circuit 50 used to transfer a positive logic pulse(s) and a negative logic pulse(s) to the word lines WL and the bit lines BL of the cell array respectively during data reading or writing. The selector circuit 50 has a PMOS transistor QP1 which is driven by a select signal /WS during reading to connect a word line WL to a pulse signal line WP and an NMOS transistor QN0 which is driven by a select signal BS to connect a bit line BL to a pulse signal line BP. The selector circuit 50 also has a reset-use NMOS transistor QN1 and a reset-use PMOS transistor QP0, which are for retaining the word line WL at a low level and holding the bit line BL at a high level in non-select events.

The select signals /WS, BS are outputs of an address decoder: in a non-select state, /WS="H" and BS="L." Thus, in the nonselect state, the select transistors QP1, PN0 turn off and the resetting transistors QN1, QP0 turn on, causing the word line WL to be set at "L" level of Vss while letting the bit line BL stay at "H" level of Vcc. In a select state, the reset transistors QN1, QP0 turn off and the select transistors QP1, QN0 turn on. During data reading, the word line WL and bit line BL are connected to the signal lines WP, BP respectively as shown in the drawing. Suppose that these signal lines WP and BP are given "H" level (for example, Vcc=1.8V) pulse and "L" level (e.g. Vss=0V) pulse, respectively when selected. Whereby, a read current flows in a memory cell MC in accordance with the turn-on time periods of the select transistors QP1, QN0.

Practically, in the case of employing the cell block arrangement such as shown in FIG. 9, the select signals /WS, BS are select signals used to select a cell block, wherein bit-line selection and word-line selection within the cell block are to be performed by the signal lines WP and BP, respectively. Practically, configurations of bitline/wordline selector circuits operatively associated with the cell block 41 shown in FIG. 9 are depicted in FIG. 11 and FIG. 12.

Figure 11:
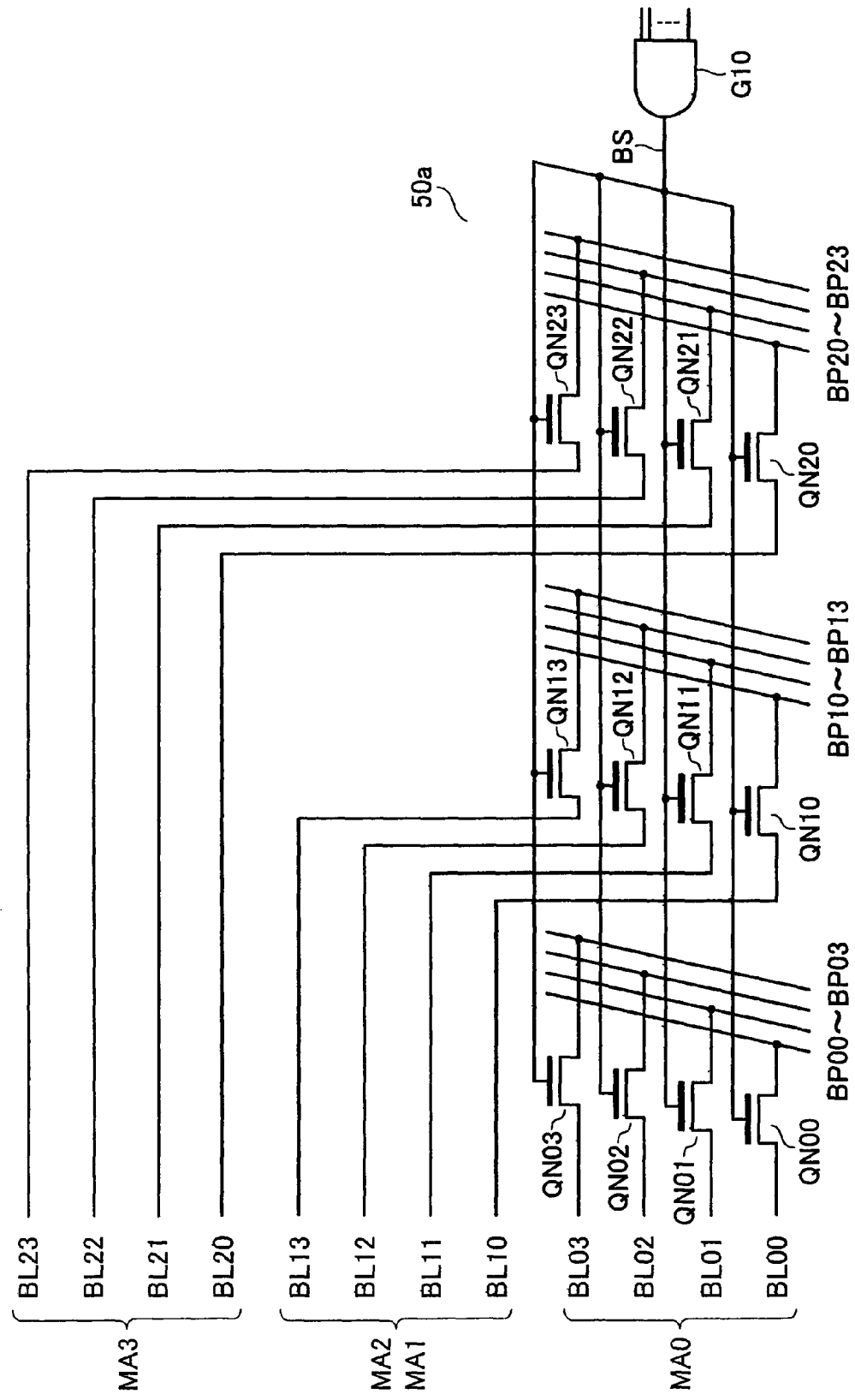
FIG. 11 is a diagram showing a bit-line selector circuit configuration of the four-cell array.

A bitline selector circuit 50a shown in FIG. 11 has NMOS transistors QN00-QN03 which are for connecting the bit lines BL00-BL03 to pulse signal lines BP00-BP03 respectively, NMOS transistors QN10-QN13 for connecting the bit lines BL10-BL13 to pulse signal lines BP10-BP13 respectively, and NMOS transistors QN20-QN23 for connecting the bit lines BL20-BL23 to pulse signal lines BP20-BP23 respectively. The gates of these NMOS transistors are commonly driven by the select signal BS. The select signal BS is activated by an AND gate G10 to become "H." Whereby, it is possible to supply a required negative logic pulse to each bit line BLij through its corresponding pulse signal line BPij and also via the turned-on NMOS transistor QNij associated therewith.

Figure 12:
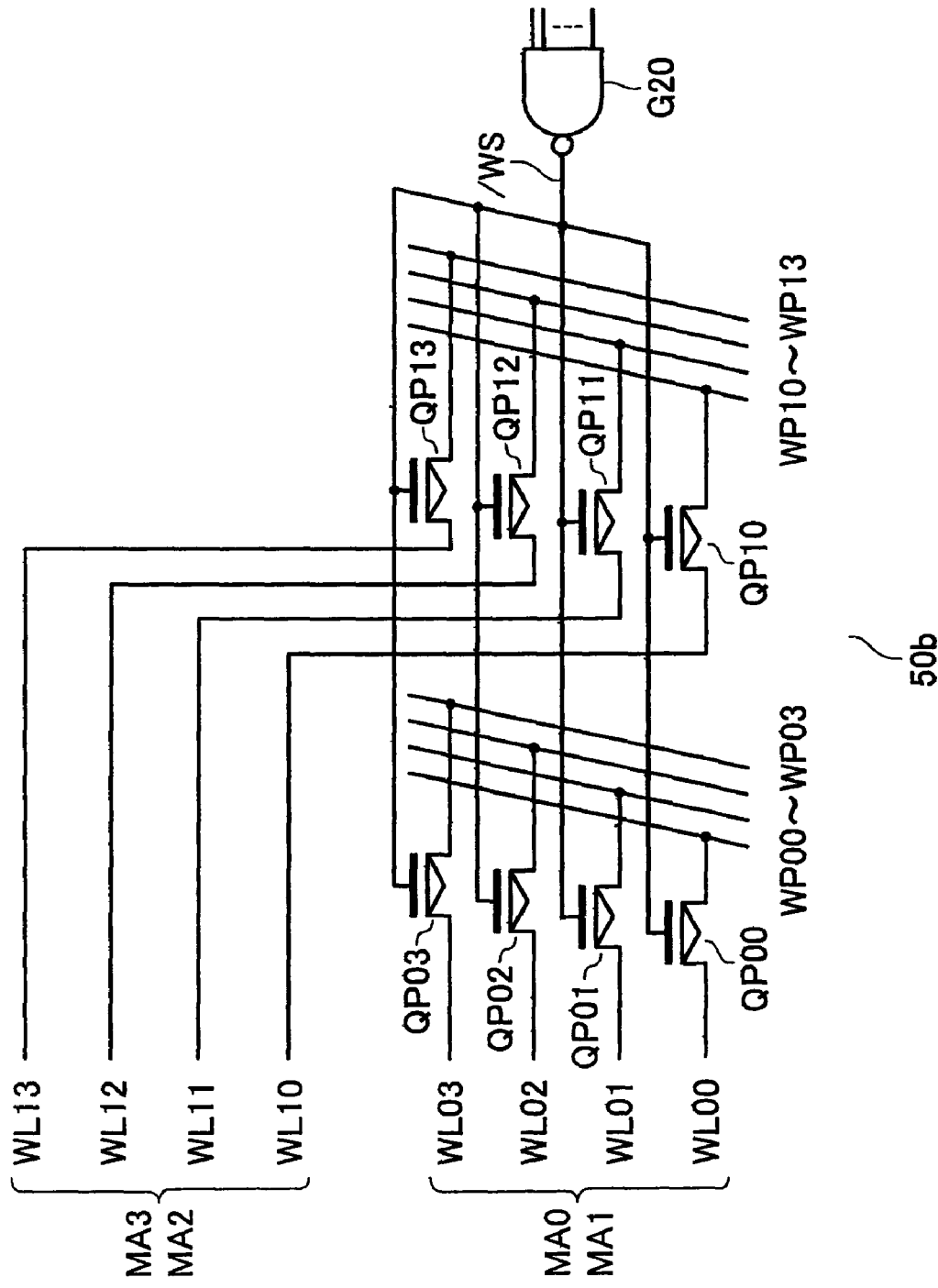
FIG. 12 is a diagram showing a word-line selector circuit configuration of the four-layer cell array.

A wordline selector circuit 50*b* shown in FIG. 12 has PMOS transistors QP00-QP03 which are for connecting the word lines WL00-WL03 to pulse signal lines WP00-03 respectively, and PMOS transistors QP10-QP13 for connecting the word lines WL10-WL13 to pulse signal lines WP10-WP13 respectively. The gates of these PMOS transistors are commonly driven by the select signal /WS. This select signal /WS is made active by a NAND gate G20 to become "L." Thus it is possible to supply a required positive logic pulse to each word line WLij through a corresponding pulse signal line WPij and also via the turned-on PMOS transistor QPij associated therewith.

The pulse signal line BPij of FIG. 11 is provided in common for a plurality of cell blocks in the direction extending at right angles to bit lines. The pulse signal line WPij of FIG. 12 is provided in common for a plurality of cell blocks in the direction at right angles to word lines. Thus it is possible to perform scanning of the bit lines and word lines within a cell block by selecting any desired cell block while using the AND gate G10 of FIG. 11 and the NAND gate of FIG. 12 as a block decode circuit in a way based on the negative logic pulse and the positive logic pulse being given to the pulse signal lines BPij, WPij respectively.

Although not specifically shown in the selector circuits 50*a*, 50*b* of FIG. 11 and FIG. 12, reset transistors for holding each bit line and word line at the high level Vcc and low level Vss respectively in the nonselect state are provided in the way shown in FIG. 10. Also note that these selector circuits 50*a*, 50*b* are formed on the silicon substrate 10 prior to formation of the three-dimensional cell array shown in FIG. 5.

When a great number of phase-change memory cells are integrated together as the three-dimensional cell array stated above, unwanted variability or irregularity in characteristics thereof causes problems. In practical use, the data state or status of a cell which utilizes the phase change of chalcogenide can change and vary depending on its past experiences (history) along with the environment thereof. An example is as follows: while setting a chalcogenide layer in the state that is full of amorphous portions—namely, in amorphous-rich state—in order to write data "0" (high resistance value state) and setting the chalcogenide layer in a crystalline part-rich state in order to write data "1" (low resistance value state), such cell's initial state is different depending on its history and position.

Figure 13:
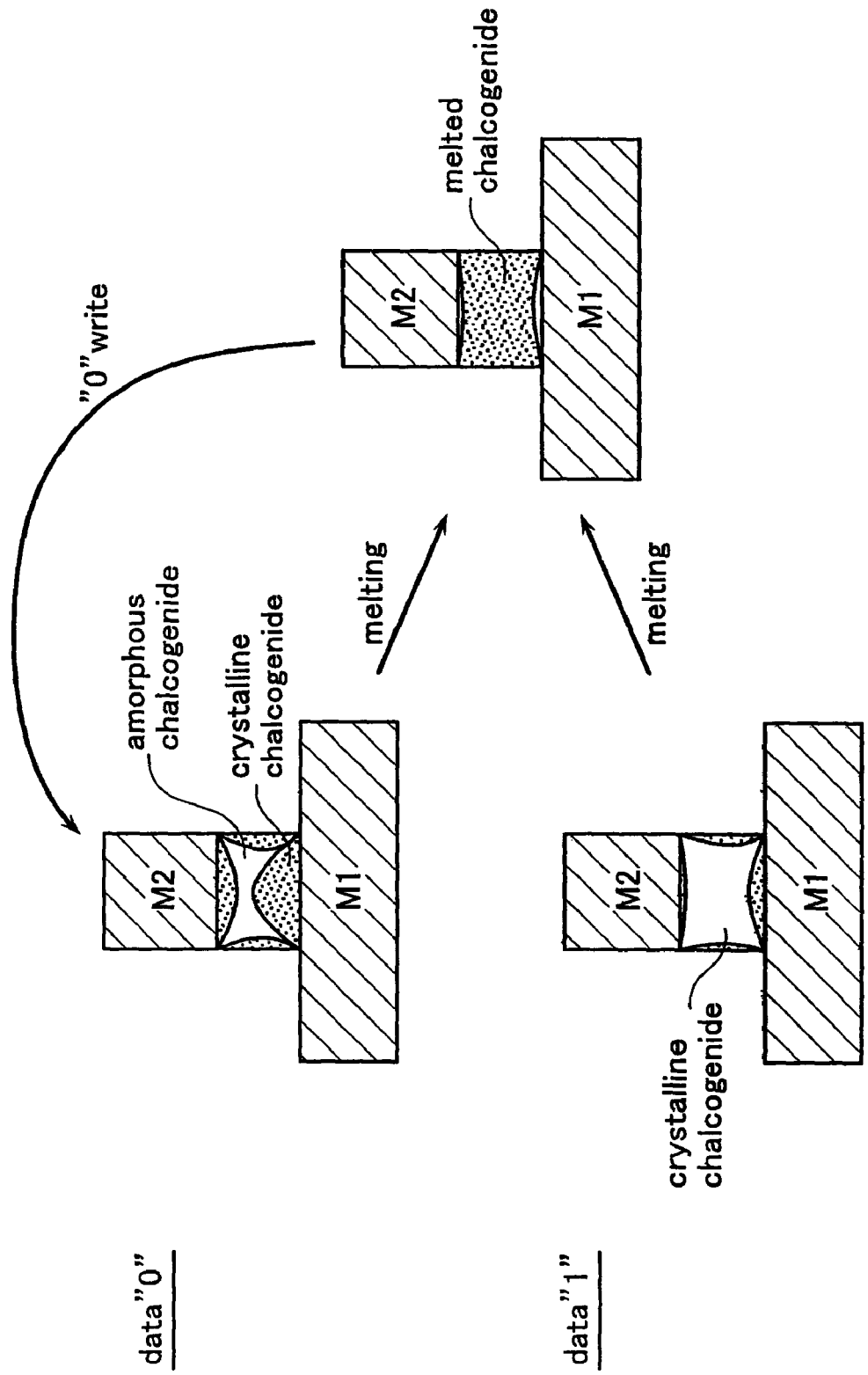
FIG. 13 is a diagram for explanation of the "0" write principle of a memory cell of this embodiment.

The cell's state change will be explained using FIG. 13 and FIG. 14. FIG. 13 shows a state change of chalcogenide in the case of writing data "0" into a cell which is in the data "0" or "1" state. In this case, give a current pulse which permits the chalcogenide layer to become in a melt state, without regard to the cell's initial state. Since the ones that become electrodes at this time are metal layers M1, M2 which interpose or "sandwich" the chalcogenide layer therebetween, portions of the chalcogenide which are good in heat conduction and are in contact with the metal faces do not lead to the melt state. Accordingly a melted or fused region behaves to expand from the center of the chalcogenide up to its peripheral portions, roughly resulting in the situation shown in the drawing. When the current pulse is cut off, heat radiates through the metal layers M1, M2 thereby causing the chalcogenide to be cooled down rapidly and thus become data "0" with increased amorphous portions. While quickly heat releasable portions are amorphized first, it is not always true that a fixed region becomes amorphous because the heat radiation situation is different on a case-by-case basis depending on the situation around the cell and its previous history or the like. This becomes the cause of unwanted variations or irregularities of the high resistance value that is obtained by "0" writing.

Figure 14:
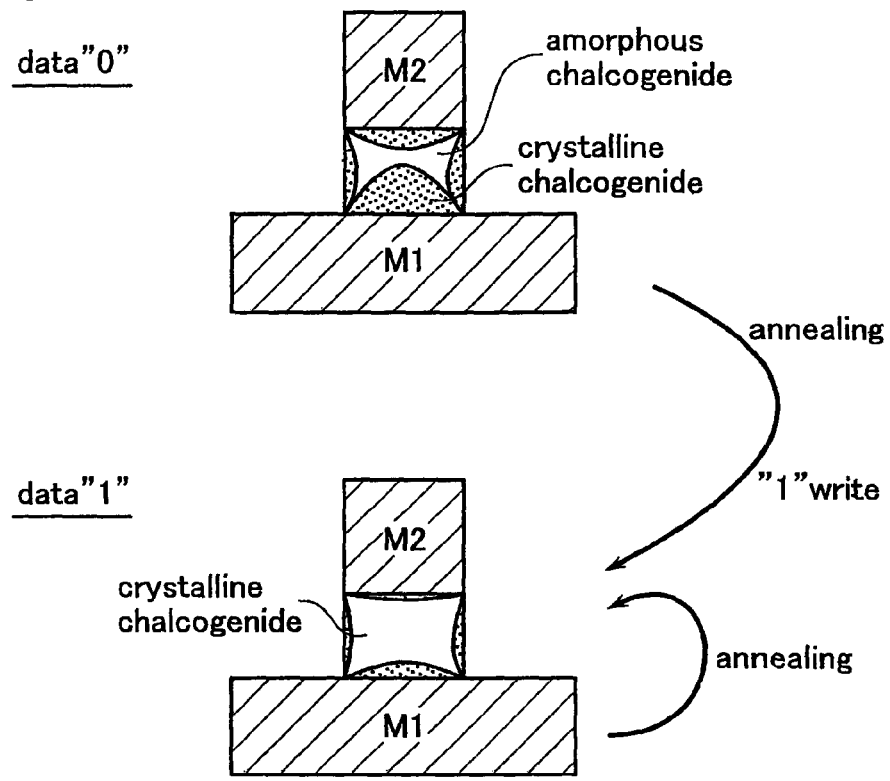
FIG. 14 is a diagram for explanation of the "1" write principle of a memory cell of this embodiment.

FIG. 14 shows the case of writing data "1" into a cell of "0" or "1" state. In this case, give a current pulse with less power concentration than during "0" writing in such a way as to heat up the chalcogenide layer for long sustaining its high temperature state without regard to the initial state of the cell. The heat-up is the Joule heating of the resistance of chalcogenide per se, resulting in an increase in temperature at an amorphous portion; then, this portion is annealed to become data "1" with increased polycrystalline portions. At this time also, how many portions of the chalcogenide are polycrystallized is different in heat radiation conditions depending upon the situation around the cell and the history up to now and the like; thus, a fixed region will not always be subjected to polycrystallization. This becomes one cause of unwanted variations or fluctuations in low resistance value of "1" writing.

Figure 15:
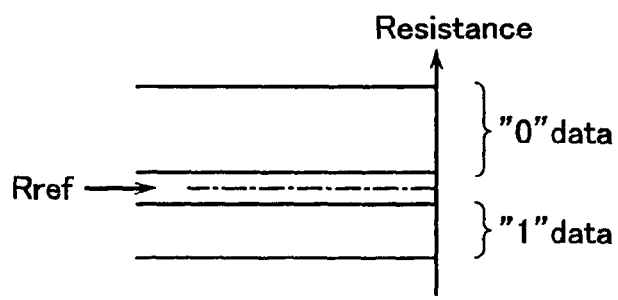
FIG. 15 is a diagram showing a resistance value distribution of data of a cell array.

Although there are the above-stated resistance value variations, when looking at a single cell, the resistance value of data "0" which was set in the amorphous state is higher than that of data "1" as set in the polycrystalline state irrespective of the environment and status thereof. Accordingly, when taking a look at a limited range of a less number of cells, a gap in which no resistance values overlap each other takes place between a high resistance value distribution of "0" data cell and a low resistance value distribution of "1" data cell, as shown in FIG. 15. It should be noted that the high resistance value distribution and the low resistance value distribution are asymmetrical in most cases, wherein the center of the gap of these distributions is changeable due to the cell array's situation. In the data state distribution such as shown in FIG. 15, it is possible to determine or judge whether the cell data is "1" or "0," by monitoring the exact resistance value of the cell by use of a reference value Rref which is indicated by arrow in the drawing.

Figure 16:
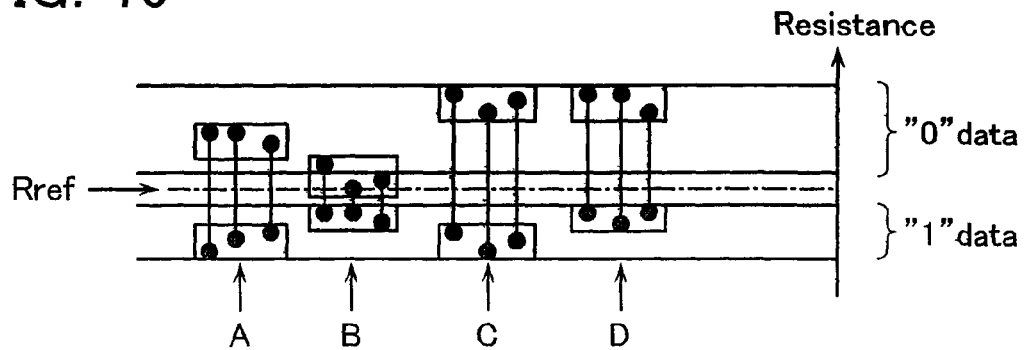
FIG. 16 is a diagram showing a resistance value distribution of data in a large-capacity cell array.

However, even if the resistance value of "1" data of a certain cell is always lower than that of "0" data, it will possibly happen that the setting of the reference value Rref is hardly achievable in cases where the cells used increase in number such as in three-dimensional cell arrays with the history and environment of each cell being significantly different within a cell array. This can be said because if the cell number increases then the gap shown in FIG. 15 gets smaller accordingly. FIG. 16 shows such a situation. In FIG. 16, there are exemplarily shown resistance value distributions of four groups A, B, C, D which are selected from among those of a large capacity of cell array and each of which includes three adjacent cells as selected therefrom at random. In this situation, although the reference value setting is enabled within each group, the setting becomes difficult with respect to an entirety of the cell array.

Consequently in this embodiment, a scheme is used which enables well stabilized data readout without having to use any reference values. This point will be explained in detail below. Even in the situation with an increased cell resistance value variation or irregularity as shown in FIG. 16, the gap between the high resistance value distribution and low resistance value distribution can still be reserved when looking at each group with an ensemble of adjacent cells. In light of this fact, this embodiment is specifically arranged to handle two cells nearly disposed as a pair and then write a high resistance value state into one of them while writing a low resistance value in the other. And a technique is used to read out the complementary data of these paired cells—say, cell pair—as a one bit of data. With such an arrangement, even in cases where a partial overlapping is present in the distributions of the cell's high resistance value state and low resistance value state in the entirety of a three-dimensional cell array, it is possible to reliably read/write the cell data with no failures while at the same time eliminating the use of the reference value Rref stated supra.

Figure 17:
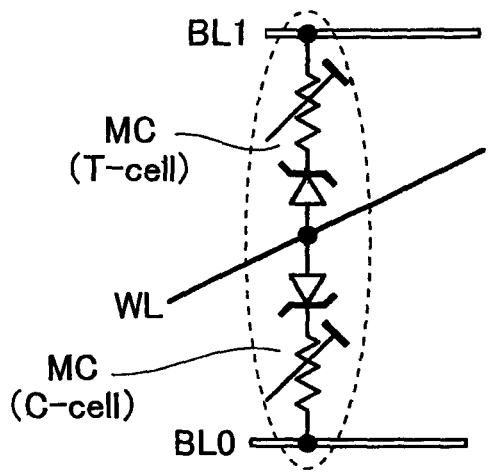
FIG. 17 is a diagram showing one arrangement method of a pair cell in accordance with this invention.
Figure 18:
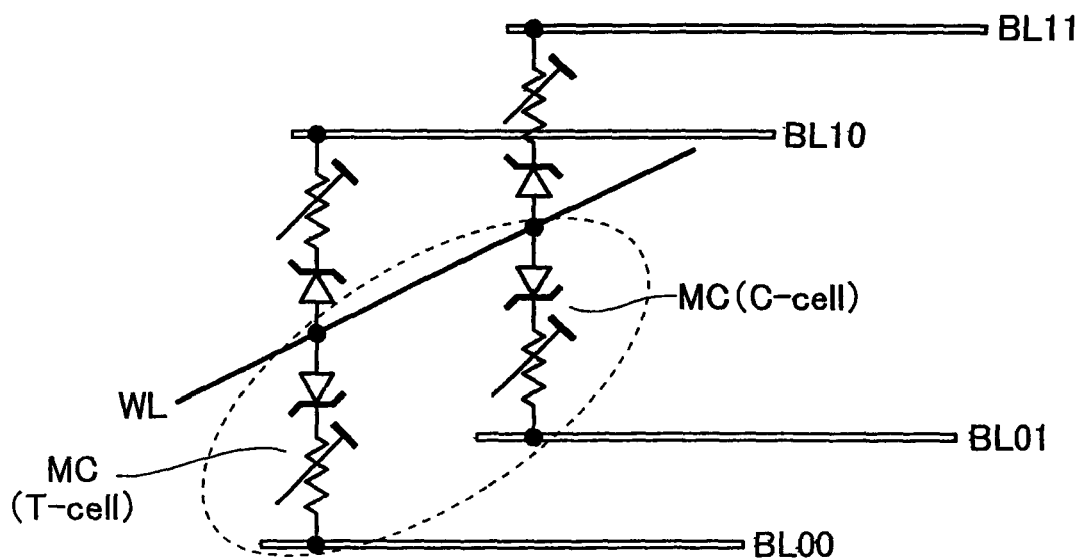
FIG. 18 is a diagram showing another arrangement method of a pair cell in accordance with this invention.

FIG. 17 and FIG. 18 show two methods for cell pair selection. In FIG. 17, a pair is configured in a way which follows: between the upper and lower neighboring cell arrays which share word lines WL, one of two upper and lower neighboring cells MC is regarded as a true-value cell (true cell) T-cell; the other is handled as a completing cell (complementary cell) C-cell. FIG. 18 is an example which makes a pair of two neighboring cells MC which are in the same cell array and which share a word line WL while being connected to different bit lines BL00, BL01. Assume in either one that the positive logical value of binary data is written into the true cell T-cell whereas the negative logic value is written into the complementary cell C-cell. More specifically, in either one of the cases of FIG. 17 and FIG. 18, the cell pair shares a word line with each cell being associated with a separate bit line.

Although a practically implemented data write/read circuit will be explained below, in the following embodiments, an explanation will be given of a three-dimensional cell array having four-layered cell arrays MA0-MA3 shown in FIG. 5 and FIG. 9. Regarding part of the cell block 41 of FIG. 9, a three-dimensional equivalent circuit and a selection method of a cell pair therein are exemplarily shown in FIG. 19 and FIG. 20 in a way corresponding to FIG. 17 and FIG. 18.

Figure 19:
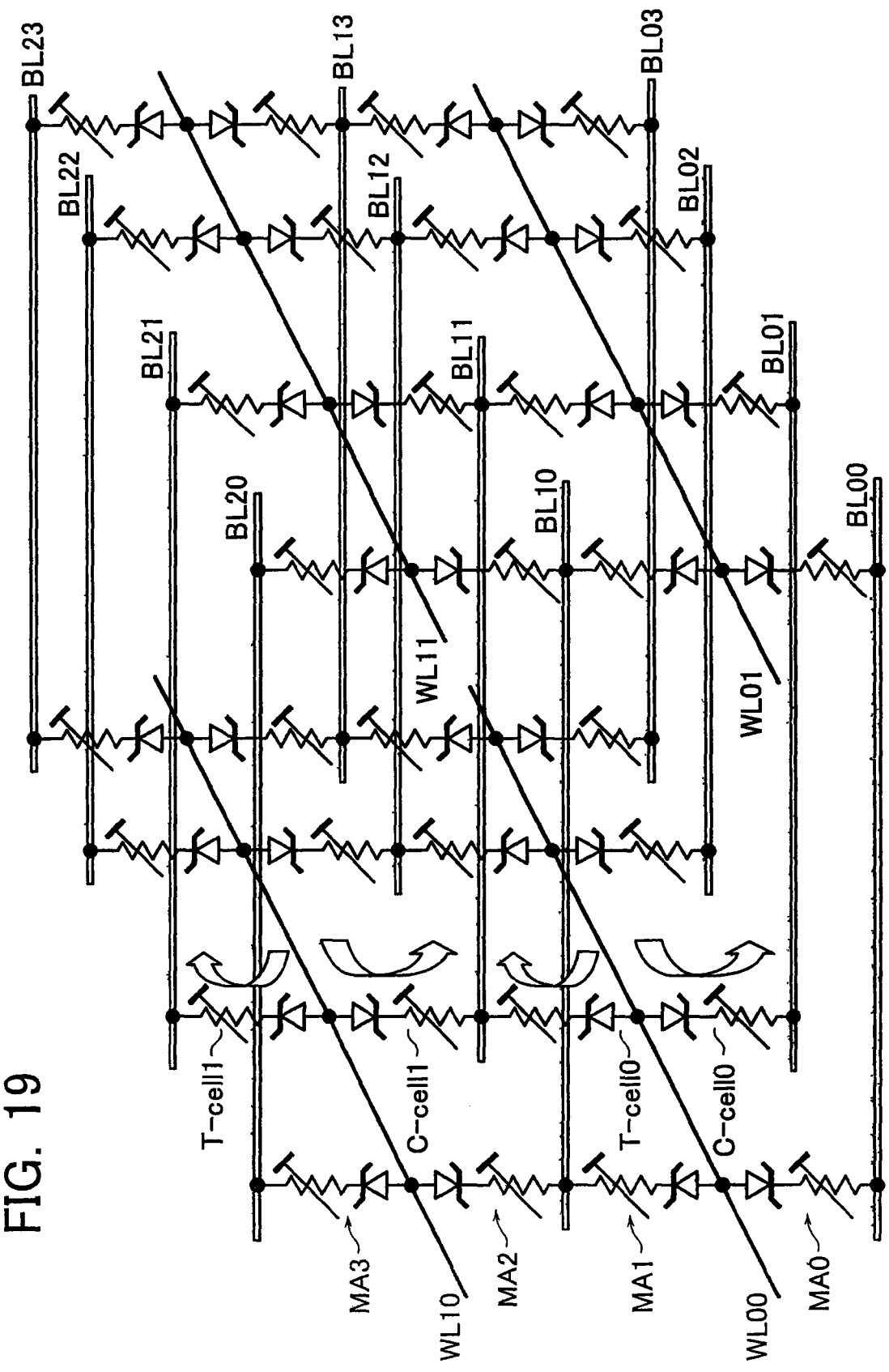
FIG. 19 is a diagram showing a three-dimensional equivalent circuit of an example which applies the pair-cell arrangement method of FIG. 17 with respect to a four-layer cell array.

In the example of FIG. 19, two upper and lower neighboring cells which belong respectively to the first layer cell array MA0 and the second layer cell array MA1 that share word lines are organized into a pair of T-cell0, C-cell0. Similarly two upper and lower neighboring cells between the third layer cell array MA2 and fourth layer cell array MA3 which share word lines are formed as a pair of T-cell1, C-cell1.

Figure 20:
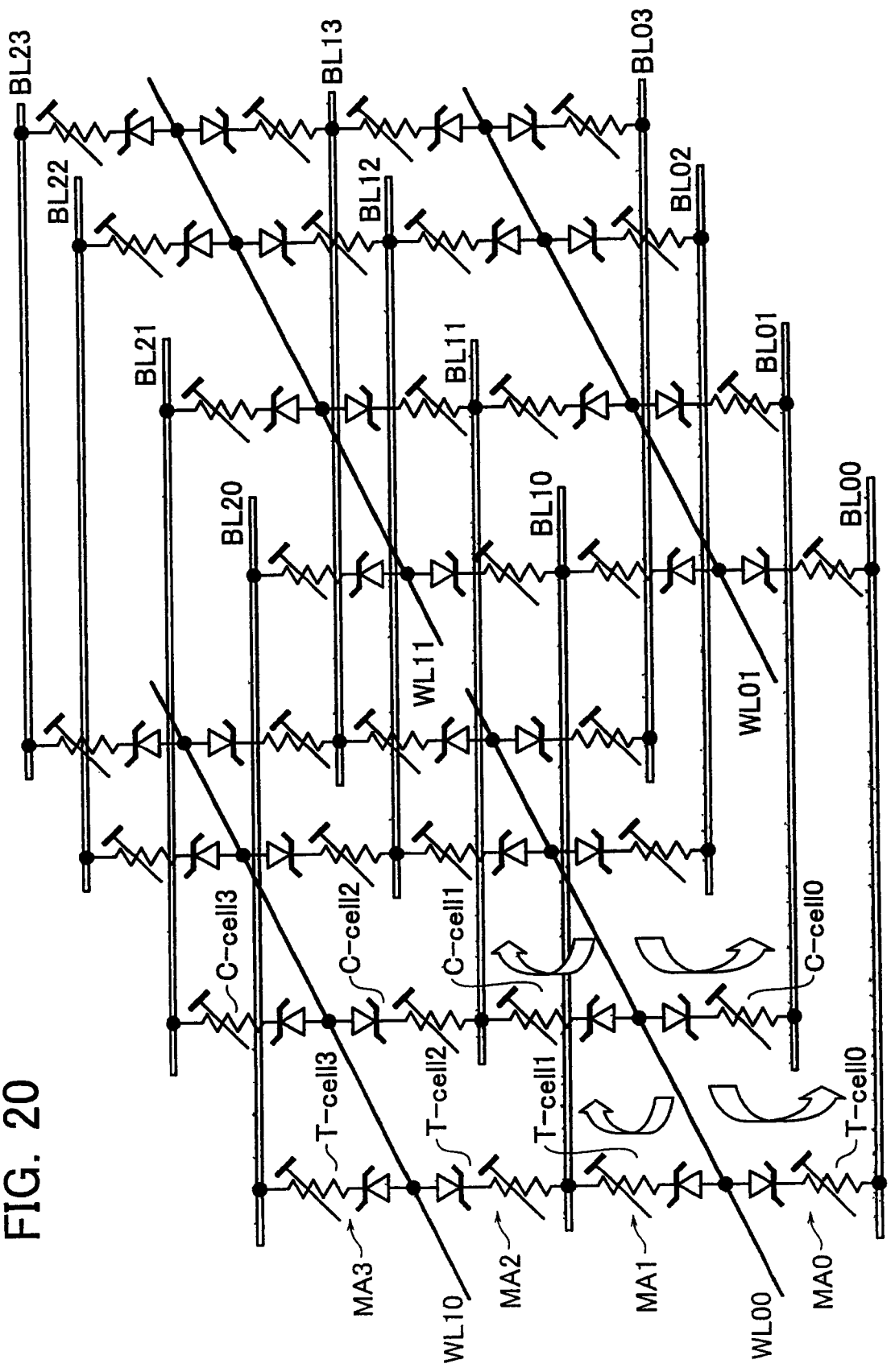
FIG. 20 is a diagram showing a three-dimensional equivalent circuit of an example which applies the pair-cell arrangement method of FIG. 18 to the four-layer cell array.

In FIG. 20, two neighboring cells within the first layer cell array MA0 which share a word line are organized into a pair of T-cell0, C-cell0. Similarly two neighboring cells within the second layer cell array MA1 which share a word line are made as a pair of T-cell1, C-cell1. The same goes with the third layer and fourth layer cell arrays MA2, MA3. In FIGS. 19-20, the direction of a current at the time of selecting each pair is shown.

An explanation will next be given of a write circuit and a read circuit which are used when writing and reading complementary data into and from a cell pair by using the three-dimensional cell array in the way stated above.

Figure 21:
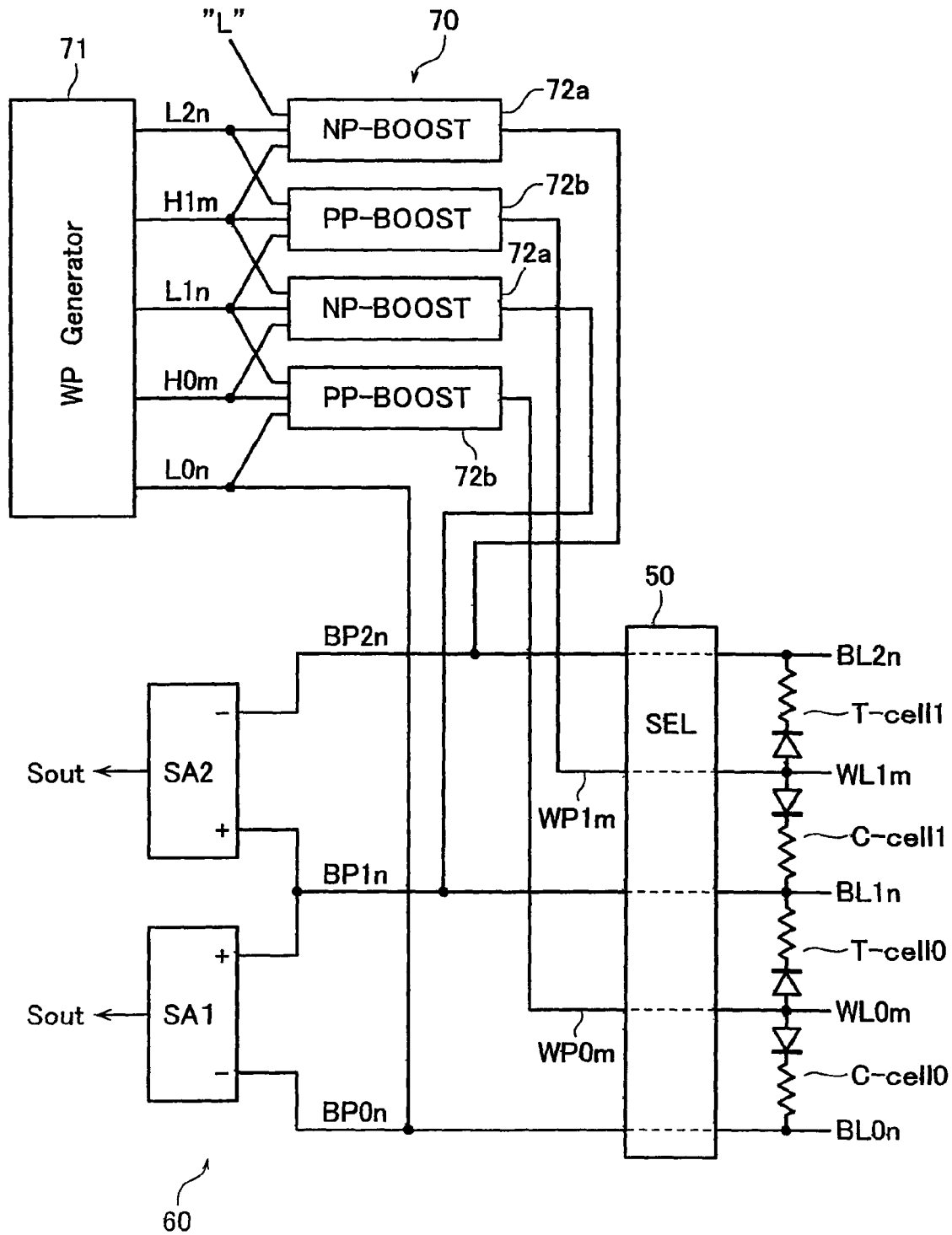
FIG. 21 is a diagram showing configurations of a read circuit and a write circuit which are applied to a three-dimensional cell array using the pair-cell arrangement method of FIG. 19.

FIG. 21 shows a read circuit 60 and a write circuit 70 with respect to two cell pairs (T-cell0, C-cell0), (T-cell1, C-cell1) which are selected by bit lines BL0n. BL1n and word lines WL0m, WL1m within the four-layer cell arrays MA0-MA3 shown in FIG. 19, where m and n are given integers. Main parts of the read circuit 60 and write circuit 70 are formed prior to formation of the cell arrays on or over the silicon substrate 10, above which the cell arrays shown in FIG. 5 are to be formed. Note however that portions of pulse voltage booster circuits 72a, 72b of the write circuit 70 are formed using the same semiconductor films as the cell arrays during the fabrication process of the cell arrays. This point will be described later. Additionally, although the read circuit 60 and write circuit 70 are obviously required so that when one of them is in active, the other is kept inactive, a control circuit unit of these active and inactive operations is omitted also in the explanation presented below.

The read circuit 60 is configured from a sense amplifier circuit SA1 which detects a difference between cell currents flowing in the bit lines BL0n, BL1n of the paired cells or pair cells C-cell0, T-cell0 that share the word line WL0m, and a sense amp circuit SA2 which detects in a similar way a difference between pair cell currents of C-cell1, T-cell1 flowing in the bit lines BL1n, BL2n that share the word line WL1m. Connected to these sense amps SA are the bit lines BL0n, BL1n, BL2n which are selected by the selector circuit 50 through signal lines BP0m, BP1, BP2n, respectively.

FIG. 21 shows the case where two neighboring cells in the lamination direction constitute a pair cell in the manner shown in FIG. 17. On the contrary, in the scheme of FIG. 18 which handles two neighboring cells within a cell array as a pair cell, the sense amps SA of the read circuit are to be connected between the neighboring bit lines within the same cell array, to which such paired cells are connected.

Figure 23:
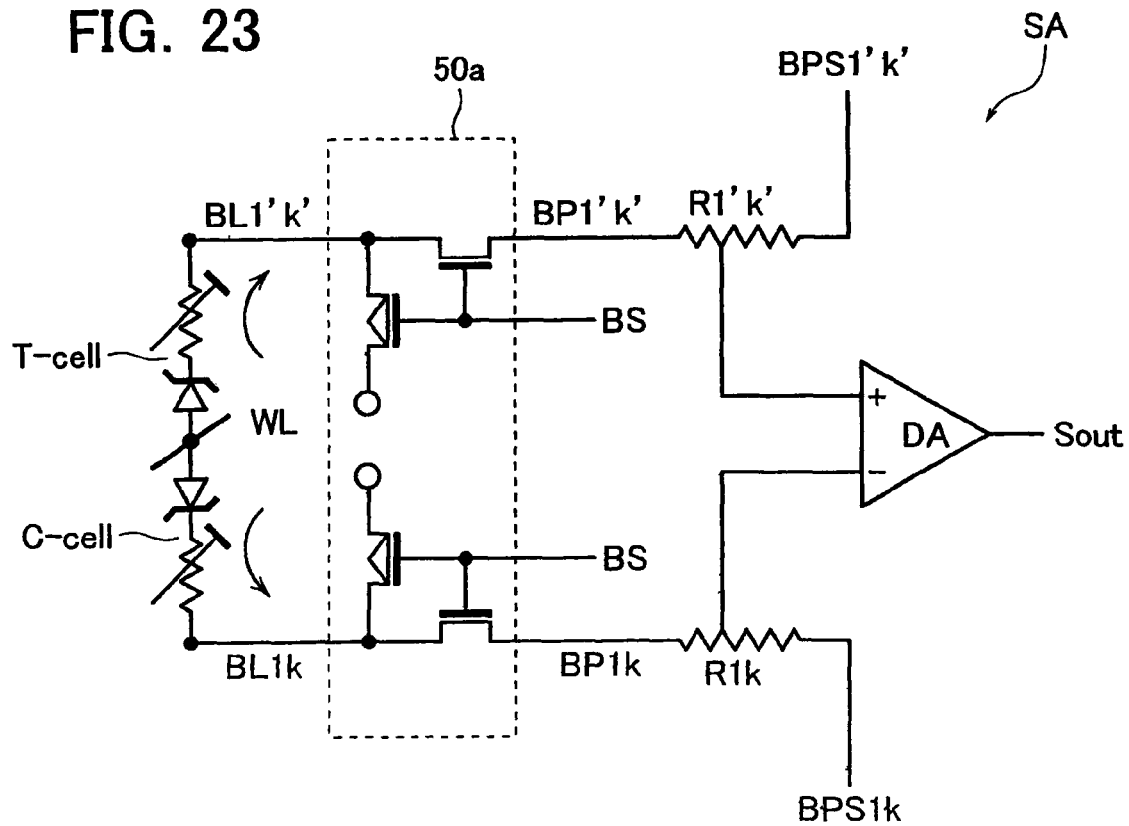
FIG. 23 is a diagram showing a sense amplifier circuit configuration in the read circuit of FIG. 21.

Practically the sense amp circuit SA is arranged as shown in FIG. 23. Bit lines BL1$k$, BL1'$k$' which are coupled to the pair cells C-cell, T-cell are connected to low potential power supply lines BPS1$k$, BPS1'$k$' through signal lines BP1$k$, BP1'$k$' and also via resistors R1$k$, R1'$k$', respectively. A word line WL is held at a low level when it is non-selected: a positive logic pulse which becomes a high level when selected is given thereto. On the other hand, as has been explained in FIG. 11, the signal lines BP1$k$, BP1'$k$' are held at a high level at the time of nonselection: during reading, a negative logic pulse voltage is selectively given thereto. Accordingly, when selected, a cell current as shown in the drawing flows in each cell. Let this cell current be converted into a voltage by the resistors R1$k$, R1'$k$'; then, detect a difference of such voltage by a differential amplifier DA. Whereby, if the pair cell data is T-cell="0" (high resistance) and C-cell="1" (low resistance), then Sout="L" (="0") is obtained; if the pair cell data is opposite then Sout="H" (="1") is obtained.

In this way, with the read circuit of this embodiment, let the bit lines that are connected to the complementary pair cells T-cell, C-cell be as inputs of the differential amplifier DA, wherein any fixed reference value is not used in any way. More specifically, convert the currents which flow in the pair cells respectively to voltages by use of the resistors; then, compare a difference of complementary data by the differential amp. With such an arrangement, it is possible to hold and read information with enhanced stability. Even where a large scaled three-dimensional cell array is used with increased variations in cell's resistance value distribution, it is possible to perform a well stabilized read operation because an appreciable difference between the high resistance value state and low resistance value state is obtainable between the neighboring pair cells as stated previously.

It should be noted that as shown in the example of FIG. 21, the stacked pair cells C-cell0, T-cell0 and pair cells C-cell1, T-cell1 share the bit line BL1n. This shared bit line BL1n is connected to input terminals of the both of two sense amp circuits SA1, SA2. Hence, these two sense amps SA1, SA2 are incapable of simultaneously detecting respective cell current differences of two pair cells. In the way discussed above, in case a bit line is shared by pair cells, it is necessary to perform the read operations due to two sense amps SA1, SA2 in a time-divisional manner as will be later described. This is also true for the case which constitutes pair cells within a cell array. In other words, in case two pair cells neighbor upon each other while sharing a bit line, two sense amp circuits which perform data detection of these two pair cells are required to perform read operations in a time-divisional fashion.

A principal concept of the write circuit 70 of this embodiment lies in that it performs a pulse-driven simultaneous writing operation with respect to a plurality of adjacent memory cells in the three-dimensional cell array. In practical use, possible combinations of at least two memory cells being subjected to such simultaneous writing are as follows. Here, the two memory cells being subject to simultaneous writing include a case of making a pair and another case of not doing so.

(1) Two upper and lower neighboring memory cells of two upper and lower neighboring cell arrays which share word lines, (2) Two upper and lower neighboring memory cells of two upper and lower neighboring cell arrays which share bit lines, and (3) Two neighboring memory cells within a single cell array which share a word line.

Practically the write circuit 70 of FIG. 21 shows an example which performs a simultaneous write operation with respect to two pair cells that are formed of four memory cells C-cell0, T-cell0, C-cell1, T-cell1 as aligned in the lamination direction of the four-layer cell array. More specifically the write circuit 70 of FIG. 21 has a write pulse generation circuit 71 which generates a positive logic write pulse and a negative logic write pulse to be given to a word line and a bit line which are selected by the selector circuit 50 respectively, and a set of pulse voltage booster circuits 72a, 72b which perform pulse width adjustment and voltage boosting operations of such positive and negative logic write pulses whenever the need arises.

The write pulse generator circuit 71 generates negative logic write pulses L0n, L1n, L2n which are to be given to the bit lines BL0n, BL1n, BL2n respectively and also positive logic write pulses H0m, H1m to be given to the word lines WL0m, WL1m respectively. Here, the negative logic write pulse L0n being given to the bit line BL0n of the lowermost layer cell array is used as a reference pulse. Specifically, the negative logic write pulse L0n is supplied to the signal line BP0n without passing through any voltage booster circuit and is supplied to the bit line BL0n via the selector circuit 50. For the other positive logic write pulses H0m, H1m and negative logic write pulses L1n, L2n, the booster circuits 72a, 72b are provided in order to perform any required potential rise-up while giving a necessary delay thereto in relation to the negative logic write pulse L0n for use as the reference.

Figure 22:
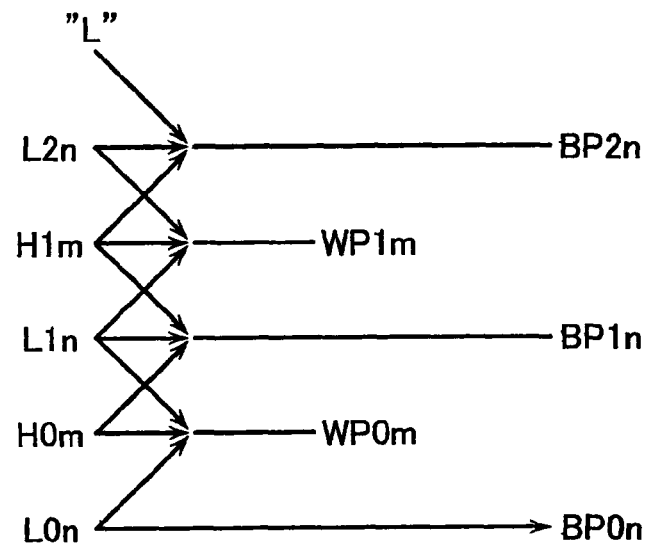
FIG. 22 is a diagram showing a positive/negative logic write pulse combining method in the write circuit of FIG. 21.

Practically the relationship of inputs to the voltage booster circuits 72a, 72b and outputs of respective booster circuits 72a, 72b is as shown in FIG. 22. To the positive pulse booster circuit (PP-BOOST) 72b which potentially raises the positive logic write pulse H0m to be given to the word line WL0m, the negative logic write pulses L0n, L1n which are to be given to the bit lines BL0n, BL1n that interpose the word line WL0m therebetween are supplied along with the positive logic write pulse H0m. Whereby, determine a voltage boosting operation and an overlap time period of the negative logic write pulses L0n, L1n and positive logic write pulse H0m in accordance with data being written. Similarly, to the negative pulse booster circuit (NP-BOOST) 72a which boosts the negative logic write pulse L1n to be given to the bit line BL1n, the positive logic write pulses H0m, H1m which are to be given to the word lines WL0m, WL1m that interpose the bit line BL1n therebetween are supplied along with the negative logic write pulse L1n. Whereby, determine a voltage boost operation and an overlap time of the positive logic write pulses H0m, H1m and negative logic write pulse L1n in accordance with data being written. Regarding the other positive logic write pulse H1m and negative logic write pulse L2n also, the pulse booster circuits 72b, 72a are used to perform the pulse overlap time determination and boost operations in a way based on similar logic.

Practically, the positive/negative logic write pulse overlap and voltage boost operations are performed in order to determine the write energy being given to a cell(s) in accordance with the data being presently written. More specifically, in a "0" writing event, short-time overlapping of the positive and negative logic write pulses and boosting of either one of them are performed for causing the cell's chalcogenide to perform the phase change as has been explained in FIG. 13. In a "1" write session, any pulse boosting is not performed while enlarging the overlap time of the positive and negative logic write pulses in order to permit the cell's chalcogenide to exhibit the phase change as explained in FIG. 14. The "L" that is input to the booster circuit 72a which potentially raises the negative logic write pulse L2n being given to the uppermost layer bit line BL2n of FIG. 21 is a potentially fixed low level input due to the absence of no further overlying word lines.

Figure 24:
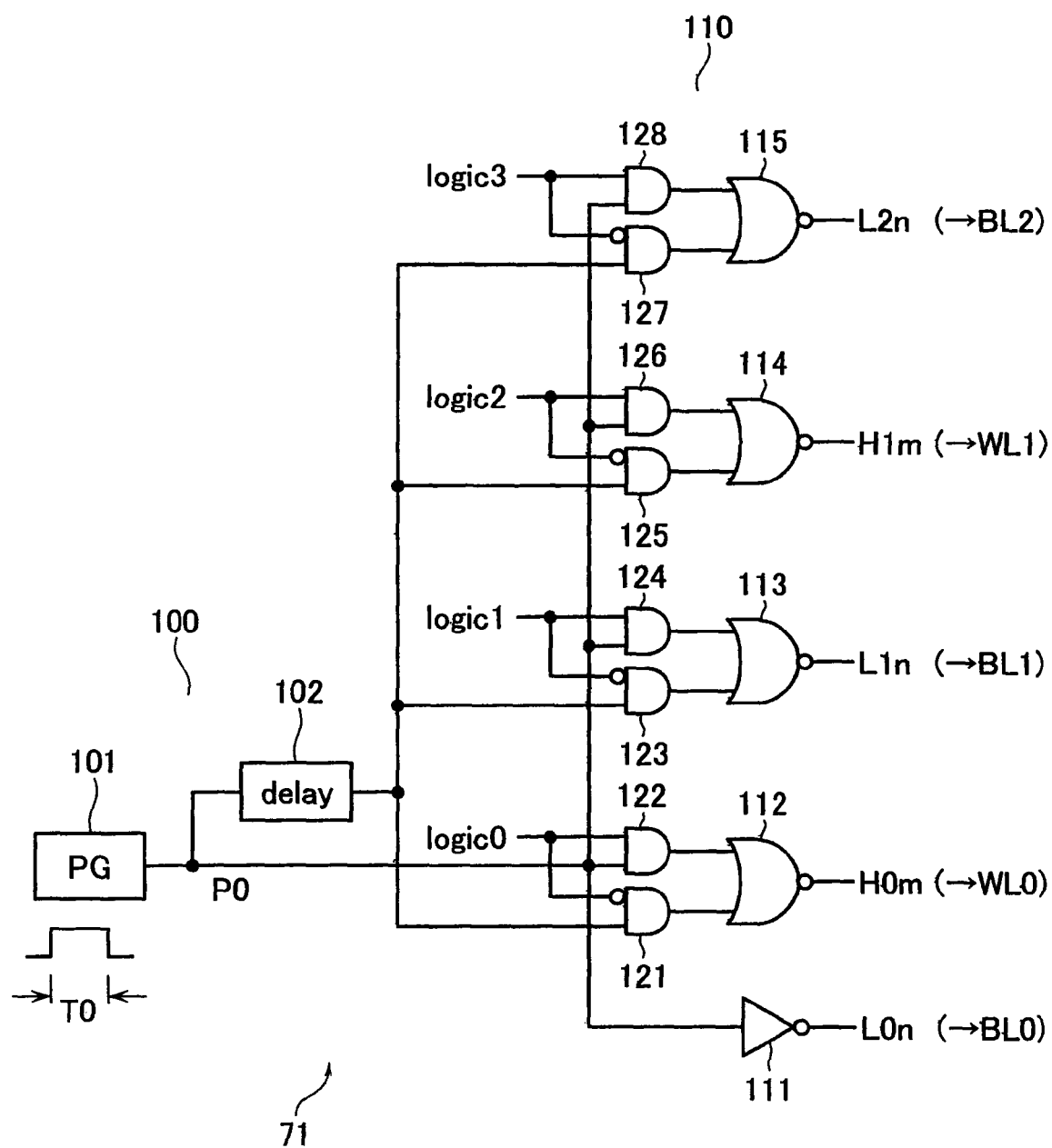
FIG. 24 is a diagram showing a configuration of a write pulse generation circuit in the write circuit of FIG. 21.

FIG. 24 shows a configuration example of the write pulse generator circuit 71. This write pulse generator circuit 71 is constructed from a pulse generating circuit 100 which generates two types of pulses that are the same in pulse width as each other and are different in delay amount from each other and a logic gate circuit 110 for generation of a required write pulse(s) based on a combination of such two types of pulses.

An original pulse generation circuit 101 is the one that generates a pulse P0 with its pulse width T0; a delay circuit 102 is the circuit which delays this pulse P0 by about T0/2. Here, let the time T0 be a time which permits the chalcogenide to become in a polycrystalline state upon application of such time pulse thereto; let T0/2 have a length which causes it to be in an amorphous state.

A negative logic write pulse which was obtained by inverting an output pulse of the original pulse generator circuit 101 by an inverter 111 becomes the negative logic write pulse L0n for use as the reference being given to the bit line BL0. In the following, the relationship of the pulses being given to the word line WL0 and bit line BL1 plus word line WL1 with respect to the negative logic write pulse for the bit line BL0 is realized by logical processing with logic signals Logic0-3 which are determined in accordance with write data. A set of AND gates 121, 122 is operatively responsive to Logic0 for selecting whether an output pulse of the pulse generator circuit 101 or a delay pulse due to the delay circuit 102. Outputs of these AND gates 121, 122 are taken out through an OR gate 112 to become the positive logic write pulse H0m which is supplied to the word line WL0.

Similarly a set of AND gates 123, 124 is responsive to receipt of Logic1 for selecting whether an output pulse of the pulse generator circuit 101 or a delay pulse due to the delay circuit 102. Whereby the negative logic write pulse L1n is obtained, which is given to the bit line BL1 via a NOR gate 113. A set of AND gates 125, 126 is responsive to Logic2 for selecting whether an output pulse of the pulse generator circuit 101 or a delay pulse due to the delay circuit 102, wherein these outputs are sent forth through an OR gate 114 to thereby obtain the positive logic write pulse H1m which is given to the word line WL1. A set of AND gates 127, 128 is responsive to Logic3 for selecting whether an output pulse of the pulse generator circuit 101 or a delay pulse due to the delay circuit 102, wherein these outputs are sent forth through a NOR gate 115 to obtain the negative logic write pulse L2n that is given to the bit line BL2.

Figure 25:
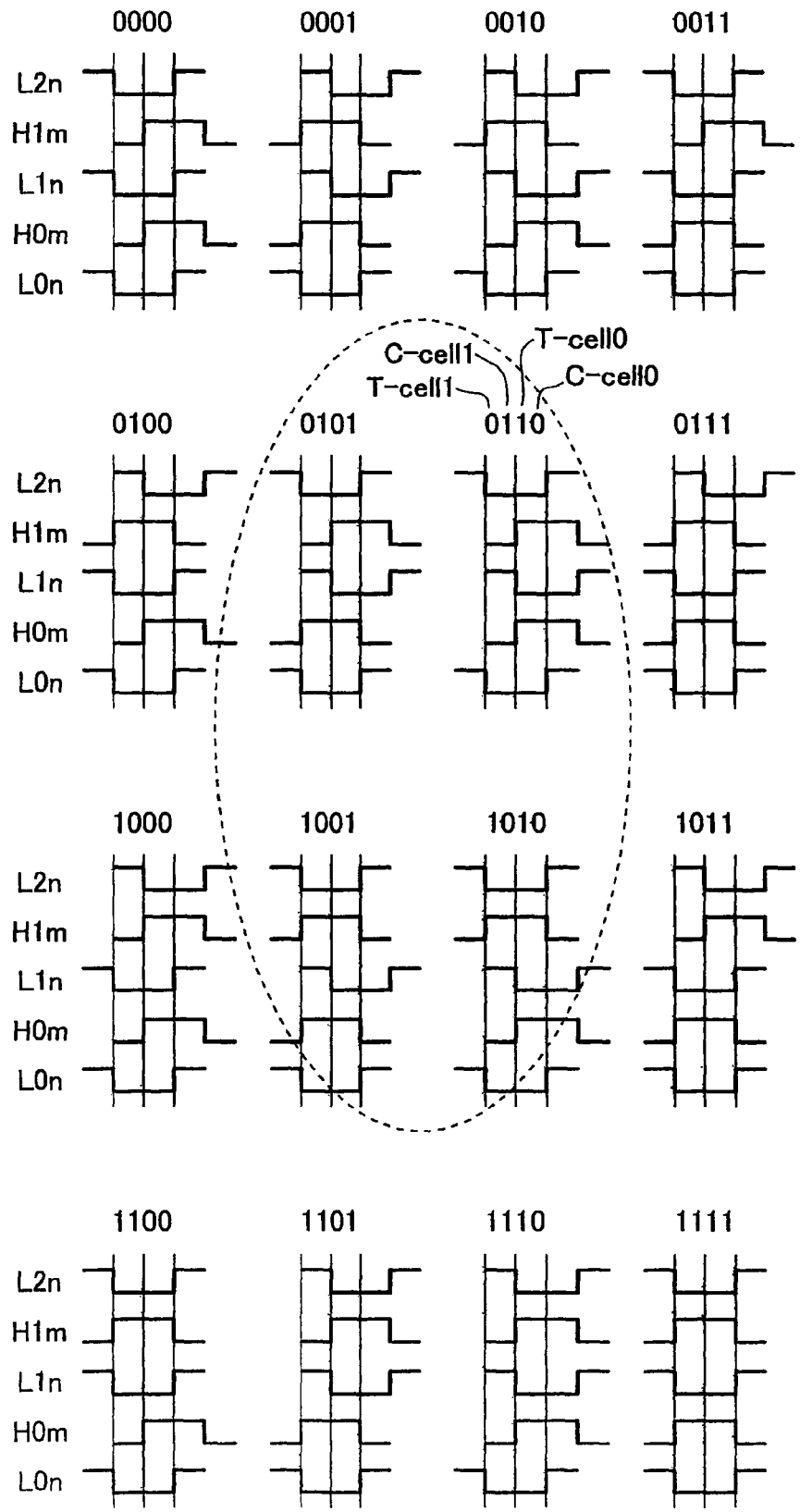
FIG. 25 is a diagram showing the waveforms of write pulse signals which are output from the same write pulse generation circuit.

Output signal waveforms of the pulse generator circuit 100 which are obtainable by all possible combinations of "0"s and "1"s of Logic0-3 are as shown in FIG. 25. There are shown herein all logic pulse signals which are necessary for independently setting up data of the four cells which are serially coupled in the lamination direction shown in FIG. 21. For a certain cell, "1" writing is performed when the overlap time period of the positive logic write pulse being given to a word line and the negative logic write pulse being given to its corresponding bit line is T0; alternatively, "0" writing is done when the overlap time is T0/2. A combination of one or more 0s and 1s which is indicated atop each of the signal waveforms of FIG. 25 is cell information at this simultaneous wiring event, wherein these are in the order of T-cell1, C-cell1, T-cell0, C-cell0 from the left to the right.

It should be noted that in this invention, complementary data bits are to be written into the cells T-cell, C-cell which make a pair together. Accordingly, the actually used ones in the output signal waveforms of FIG. 25 are only four output signals as circled by dotted line, wherein one of T-cell, C-cell is "0" and the other is "1."

Figure 26:
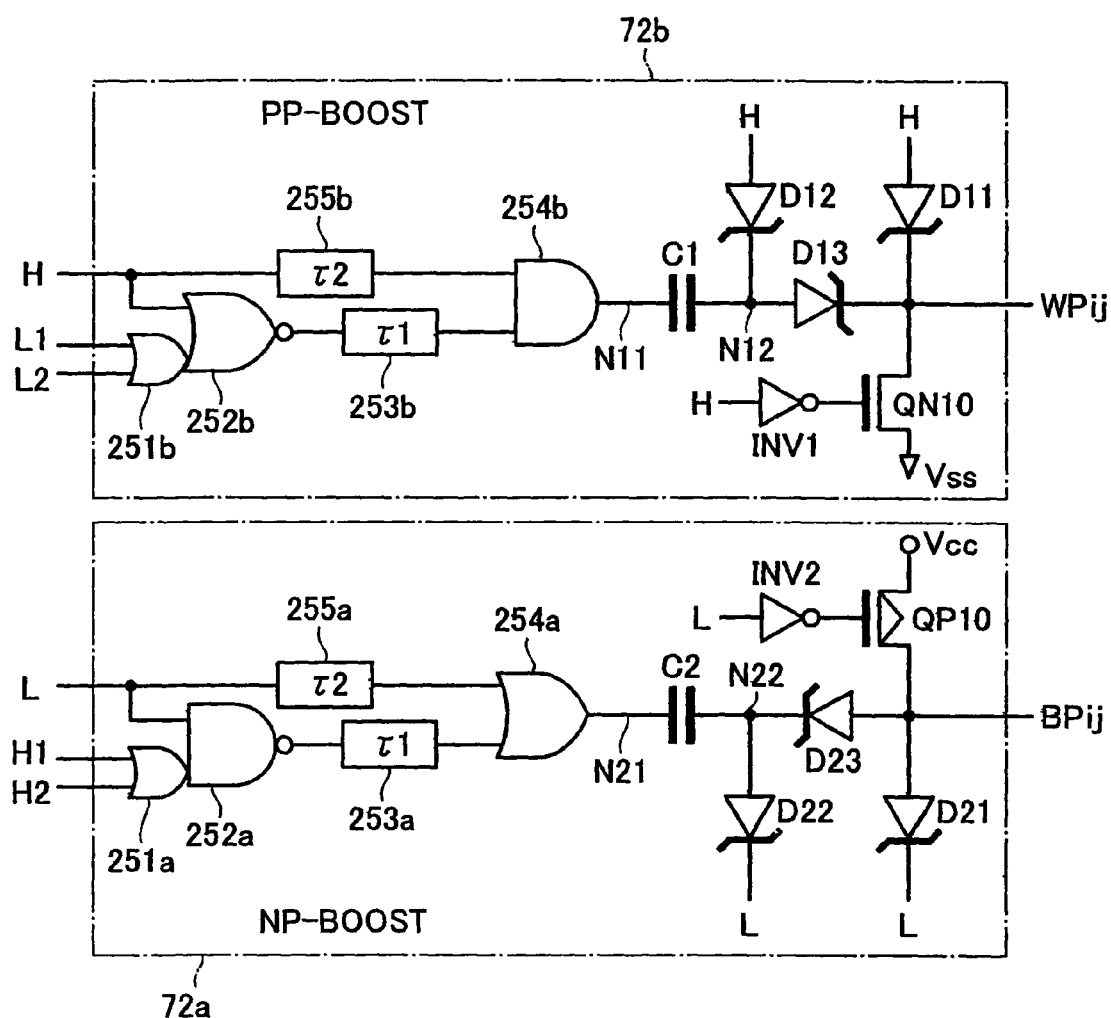
FIG. 26 is a diagram showing a configuration of a pulse booster circuit in the write circuit of FIG. 21.

As shown in FIG. 21, the write pulse signals L0n, L1n, L2n, H0m, H1m of FIG. 25 are such that a positive logic write pulse or a negative logic write pulse is potentially raised by a corresponding one of the pulse voltage booster circuits 72a, 72b in the case of "0" writing. Detailed configurations of these booster circuits 72a, 72b are shown in FIG. 26.

Negative logic pulses L1, L2 which enter the positive pulse booster circuits 72b along with a positive logic pulse H are shown in FIG. 21 as the ones that are supplied to bit lines of the upper and lower cell arrays which share word lines with the positive logic pulse H being given thereto. Similarly, positive logic pulses H1, H2 entering the negative pulse booster circuits 72a together with a negative logic pulse L are shown in FIG. 21 as the ones that are supplied to word lines of the upper and lower cell arrays which share bit lines to which the negative logic pulse L is given.

The positive and negative pulse booster circuits 72b, 72a each have capacitors C1, C2 which are used to potentially raise or boost the signal lines WPij, BPij through charge-pump operations, respectively. Provided at respective nodes N12, N22 of the capacitors C1, C2 on the signal line WPij, BPij sides are a reset-use NMOS transistor QN10 and a resetting PMOS transistor QP10 which are for holding these nodes at Vss, Vcc respectively in a nonselect state. When the positive logic write pulse H and negative logic write pulse L are generated, these resetting transistors QN10, QP10 are driven thereby to turn off, respectively.

Connected to the nodes N12, N22 are diodes D12, D22 which are used to charge the capacitors C1, C2 up to the level of the positive logic pulse H (for example, Vcc) and the level of negative logic pulse L (e.g. Vss) in a select state, respectively. The nodes N12, N22 are connected to the signal lines WPij, BPij through diodes D13, D23 for use as transfer elements, respectively. Diodes D11, D21 are connected to these signal lines WPij, BPij, which diodes are for giving thereto the positive logic pulse H and negative logic pulse L when selected. In the nonselect state, the other nodes N11, N21 of the capacitors C1, C2 are arranged to be held at Vss, Vcc by outputs of an AND gate 254b and an OR gate 254a, respectively.

In the positive pulse booster circuit 72b, a pulse which is obtained by a delay circuit 255b that slightly delays the positive logic pulse H enters at one input terminal of the AND gate 254b; to the other input terminal, a detection result of overlap states of the positive logic pulse H and negative logic pulses L1, L2 which is obtained by an OR gate 251b and a NOR gate 252b is input through a delay circuit 253b. In the negative pulse booster circuit 72a, a pulse which is obtained by a delay circuit 255a that slightly delays the negative logic pulse L enters to one input terminal of the OR gate 254a; to the other input terminal, a detection result of overlap states of the negative logic pulse L and positive logic pulses H1, H2 which is obtained by an OR gate 251a and NAND gate 252a is input via a delay circuit 253a. Set a delay time of the delay circuit 253a, 253b at about T/2 with respect to the width T of each write pulse.

Operations of the pulse booster circuits 72a, 72b that are arranged in this way will be explained using FIG. 27. In a nonselect state in which the positive and negative logic write pulses are not generated, the positive pulse booster circuit 72b is such that the output of AND gate 254b is at Vss and the NMOS transistor QN10 turns on so that the nodes N11, N12 of the capacitor C1 are at Vss. Similarly in the nonselect state, the negative pulse booster circuit 72a is such that the output of OR gate 254a is at Vcc and the PMOS transistor QP10 turns on so that the nodes N21, N22 of the capacitor C2 are held at Vcc.

Figure 27:
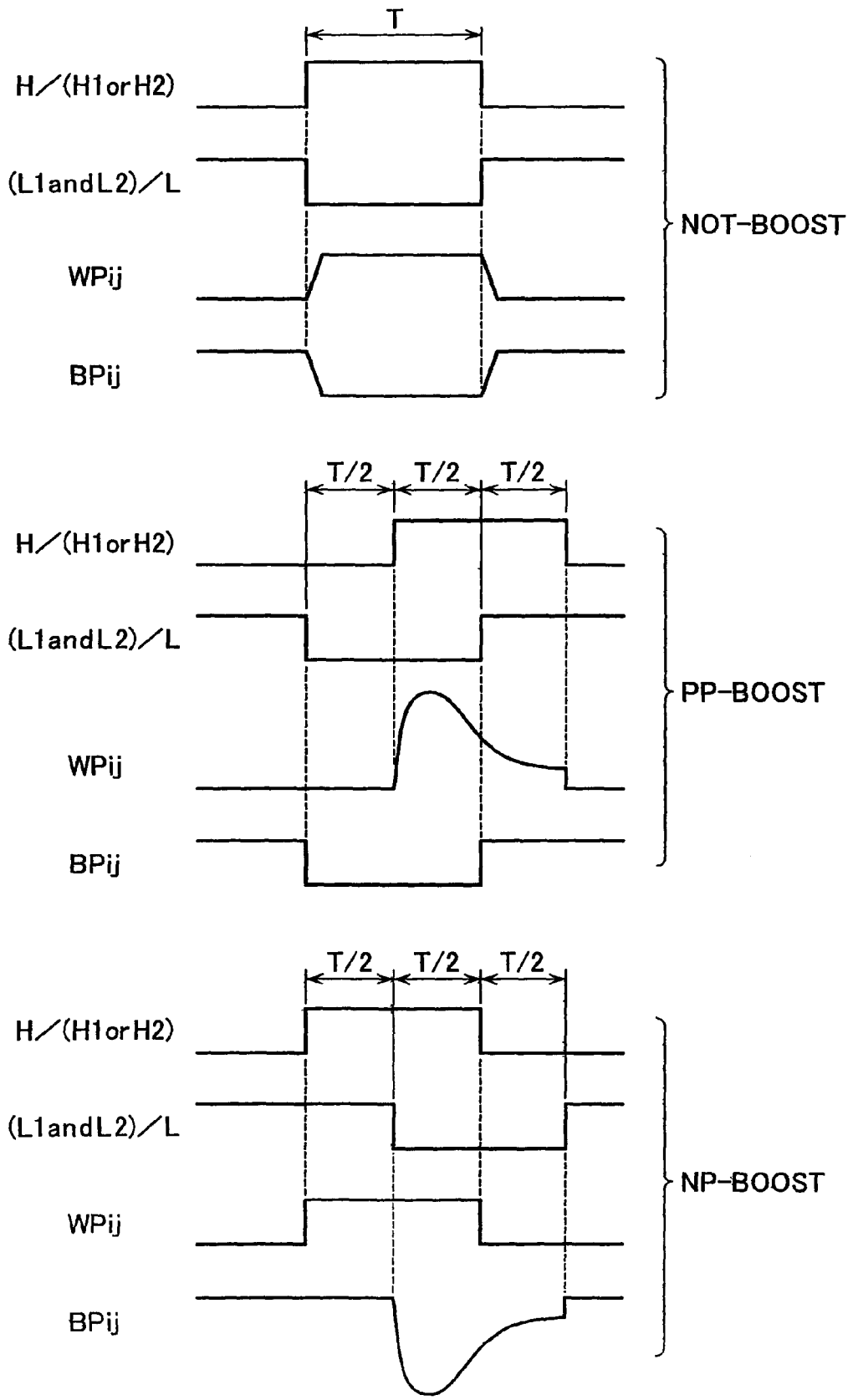
FIG. 27 is a diagram showing operation waveforms of the pulse booster circuit.

As shown in FIG. 27, in case the positive logic write pulse H with its pulse width T is generated simultaneously along with the negative logic write pulses L1, L2 of the same pulse width T, in the positive pulse booster circuit 72b, the capacitor C1 is charged by the diode D12 to N12=Vcc, N11=Vss. As the output of AND gate 254b holds the low level Vss, the positive logic write pulse H is given to the signal line WPij through the diode D11, with no changes added thereto. In case the negative logic write pulse L with its pulse width T is generated simultaneously along with the positive logic write pulses H1, H2 of the same pulse width T, in the negative pulse booster circuit 72a, the capacitor C2 is charged by the diode D22 to N22=Vss, N21=Vcc. Since the output of OR gate 254a holds the high level Vcc, the negative logic write pulse L is given to the signal line BPij via the diode D21 without any changes added thereto. In these cases, the capacitors C1, C2 perform no discharging operations so that any pulse voltage potential rise-up is not performed.

Next, in case the positive logic write pulse H is generated so that it is delayed relative to the negative logic write pulses L1 and L2 by half of their pulse width, i.e. T/2, a positive-directional potential raising operation of the positive logic write pulse H is carried out in the positive pulse booster circuit 72b. More specifically, in the positive pulse booster circuit 72b at this time, when the positive logic write pulse H becomes its high level, the capacitor C1 is charged up so that N12=Vcc and N11=Vss. And, with a delay of the delay time of the delay circuit 255b, the output of AND gate 254b becomes H, that is, N11=Vcc; thus, positive charge of the capacitor C1 is transferred through the diode D13 toward the signal line WPij. More specifically the positive logic write pulse H which is given via the diode D11 to the signal line WPij by a charge pump operation by the capacitor C1 and diodes D12, D13 is boosted to potentially increase in the positive direction. In other words, a discharge current that is determined by the capacitance value and charging voltage of the capacitor C1 is added to a write current being supplied to a selected cell through the diode D11. If the relationship between the positive logic write pulse H1 or H2 and the negative logic write pulse L is the same, then there is no such potential boost operation in the negative pulse booster circuit 72a.

Next, in case the positive logic write pulse H is generated so that it is advanced relative to the negative logic write pulses L1 and L2 by half of their pulse width T/2, a negative-directional potential boost operation of the negative logic write pulse L is performed in the negative pulse booster circuit 72a. More specifically at this time, in the negative pulse booster circuit 72a, when the negative logic write pulse L becomes its low level, the capacitor C2 is charged up so that N22=Vss and N21=Vcc. And, with a delay of the delay time of the delay circuit 255a, the output of OR gate 254a becomes L, that is, N21=Vss; thus, negative charge of the capacitor C1 is transferred through the diode D23 to the signal line BPij. More specifically the negative logic write pulse L which is given via the diode D21 to the signal line BPij by a charge pump operation by the capacitor C2 and diodes D22, D23 is boosted in the negative direction. If the relationship between the positive logic write pulse H1 or H2 and the negative logic write pulse L is the same, then there is no such boost operation in the positive pulse booster circuit 72b.

The pulse width T of the positive and negative logic write pulses H, L shown in FIG. 27 is a pulse application time period that is required for "1" data writing. A potentially raised positive or negative pulse with a substantially T/2 pulse width as obtained by control of an overlap state of these write pulses is given to a word line or bit line as required for "0" data writing. With the use of the pulse booster circuitry of FIG. 26, it is possible to potentially raise or boost by the capacitor the high level or the low level of a short pulse application time necessary for "0" data writing and then supply a write current determined by the capacitance value of the capacitor to a cell(s). Thus, building such pulse booster circuitry into the write circuit makes it possible to reliably perform, with no failures, the "0" data writing irrespective of the original data state.

Figure 28:
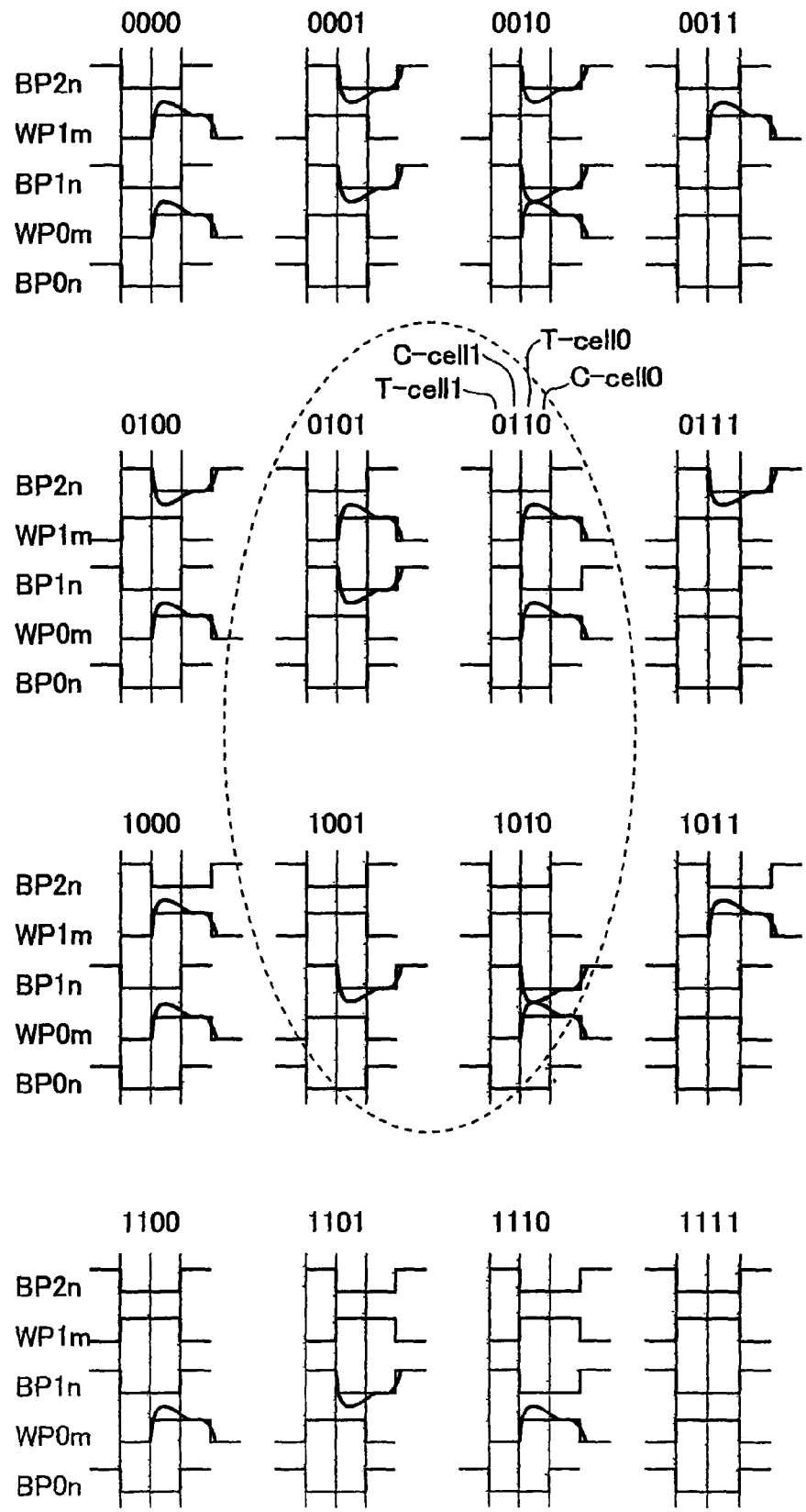
FIG. 28 is a diagram showing the waveforms of write pulse signals that are potentially raised or boosted by the pulse booster circuit in a way corresponding to the write pulse signal waveforms of FIG. 25.

FIG. 28 shows positive and negative logic write pulse waveforms which are given to the signal lines BP0n, WP0m, BP1n, WP1m, BP2n respectively by letting the positive and negative logic pulses L0n, H0m, L1n, H1m, L2n shown in FIG. 25 pass through the pulse booster circuits 72a, 72b. Whereby, with respect to a "0"-write cell in which the write pulse time becomes T/2, the positive logic write pulse to be given to a word line is potentially raised in the positive direction or, alternatively, the negative logic write pulse being given to a bit line is boosted in the negative direction. In FIG. 28 also, part circled by broken line in a way corresponding to FIG. 21 will be actually used in this invention. Four bits of data as described atop a signal waveform group are such that the first bit corresponds to T-cell1, second bit corresponds to C-cell1, third bit to T-cell0, and fourth bit to C-cell0 as described previously.

In the way stated above, it becomes possible for the write circuit 70 of this embodiment shown in FIG. 21 to inject into the chalcogenide the energy significant enough to generate a phase change necessary for "0" writing by the pulse boost operation which utilizes rapid discharge of the charge as accumulated in a capacitor in a way irrespective of the initial data state of a cell.

In the embodiments discussed up to here, a specific case has been explained where every couple of neighboring cells in the lamination direction of four-layer cell arrays constitute a pair cell in the way shown in FIG. 19. An explanation will next be given of a data write method in case where two neighboring cells within a cell array make up a pair cell as shown in FIG. 20.

In the above-noted embodiment, four cells that are aligned or queued in the lamination direction make up two pair cells, which are subjected to writing simultaneously. In contrast, in the scheme of FIG. 20, four true cells T-cell0 to T-cell3 are serially connected in the lamination direction, and four complementary cells C-cell0-3 which are connected in series in the lamination direction are disposed so that these neighbor upon the former cells. Accordingly, when applying the scheme in a similar way to the above-noted embodiment which performs simultaneous writing to the cells in the lamination direction, it becomes necessary to distinguish in timing the writing relative to the four true cells T-cell0-3 from the writing to the four complementary cells C-cell0-3.

Figure 29:
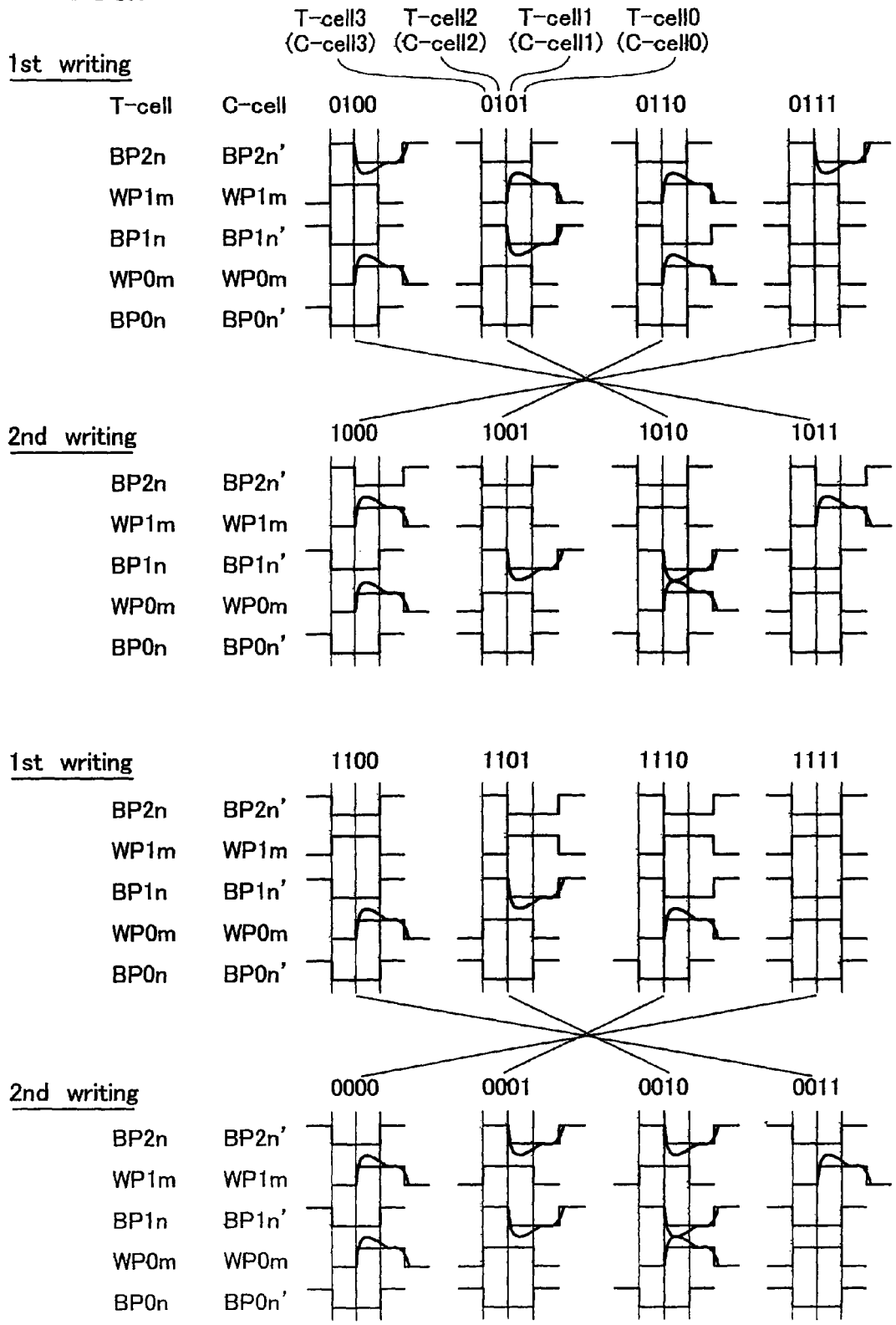
FIG. 29 is a diagram showing write pulse waveforms by two successive write operations with respect to two pair cells in the case of employing the pair-cell arrangement method of FIG. 20.

FIG. 29 shows write pulse waveforms which utilize such two-time write operation. Although the to-be-written bit states and waveforms are principally the same as those of FIG. 28, the former is different from the latter in write procedure. In a first write operation, writing is performed with respect to either group of T-cell0-3 or C-cell0-3; in a second write operation, writing is done relative to the other. An alignment of 0s and 1s atop a set of waveforms indicates, from its left side, the data bits of cells from the upper to the lower part in the lamination direction. Practically, in the first writing, write positive logic values into the four true cells T-cell0-3 simultaneously while selecting their corresponding bit lines. In the second writing, write negative logic values into the four complementary cells C-cell0-3 simultaneously while selecting their corresponding bit lines. Since T-cell and C-cell which make a pair in a lateral direction are required to store therein complementary data, the signals that are tied together by a line segment between the two times of write operations in FIG. 29 are to be selected during such two successive write operations.

In this way, during the simultaneous writing to the series-connected four cells in the lamination direction, waveform changes which are different between during "0" write and during "1" write are given to the pulse waveforms of the signal lines WP0m, WP1m as connected to word lines WL0, WL1 and of the signal lines BP0n to BP2n and BP0n'-BP2n' as coupled to bit lines BL0-BL2 as shown in FIG. 29. This means that pulse booster circuits are required for both the signal lines extending both in a longitudinal direction and in a lateral direction of the cell array, resulting in the write circuit being complicated in configuration.

Figure 30:
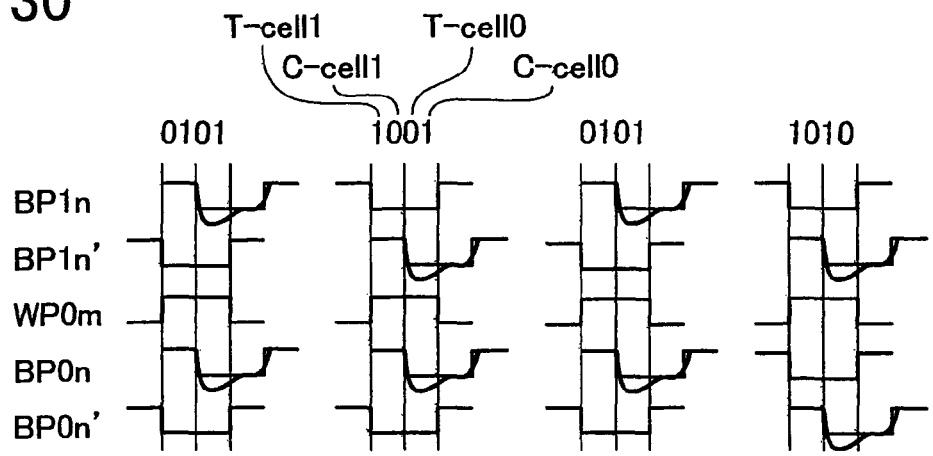
FIG. 30 is a diagram showing other write pulse waveforms with respect to 2 pair cells when similarly employing the pair-cell arrangement method of FIG. 20.

In contrast thereto, another write method capable of greatly simplifying the write circuit will next be explained. When the complementary pair cell arranging method such as shown in FIG. 20 is employed, it will not always be necessary to perform simultaneous writing with respect to the four cells in the lamination direction. In view of this, it is possible to perform simultaneous writing to two pair cells which are made up of four mutually neighboring cells within two neighboring cell arrays. Practically, perform simultaneous writing with respect to four cells T-cell1, C-cell1, T-cell0, C-cell0 of two neighboring cell arrays MA0, MA1 among the four-layer cell arrays in FIG. 20. Write pulse waveforms at this time are shown in FIG. 30.

A positive logic write pulse for use as a reference is given to the signal line WP0m which is coupled to the word line WL0m. A negative logic write pulse which is obtained by applying appropriate delaying and pulse boosting processing to the reference positive logic write pulse in accordance with data is given to the signal lines BP0n, BP0n', BP1n, BP1n' which are coupled to four bit lines BL0n, BL0n' BL1n, BL1n' that are to be selected simultaneously. 0s and 1s which are described atop a pulse waveform of the drawing are setup data of T-cell1, C-cell1, T-cell0, C-cell0 of FIG. 20, sequentially from the left.

Regarding the upper-side neighboring cell arrays MA2, MA3 of the four layers of cell arrays, simultaneous writing may be performed to four cells of two pair cells while giving similar write pulses in a separate write cycle.

With the use of such writing scheme, the potentially raised data-matched pulse waveforms may be used only for the negative logic write pulse to be given to bit lines. Accordingly, the positive pulse booster circuits 72b become unnecessary in the circuitry shown in FIG. 21 which includes the positive pulse booster circuits 72b and negative pulse booster circuits 72a; thus, the resultant write circuit becomes simplified in configuration.

Figure 32:
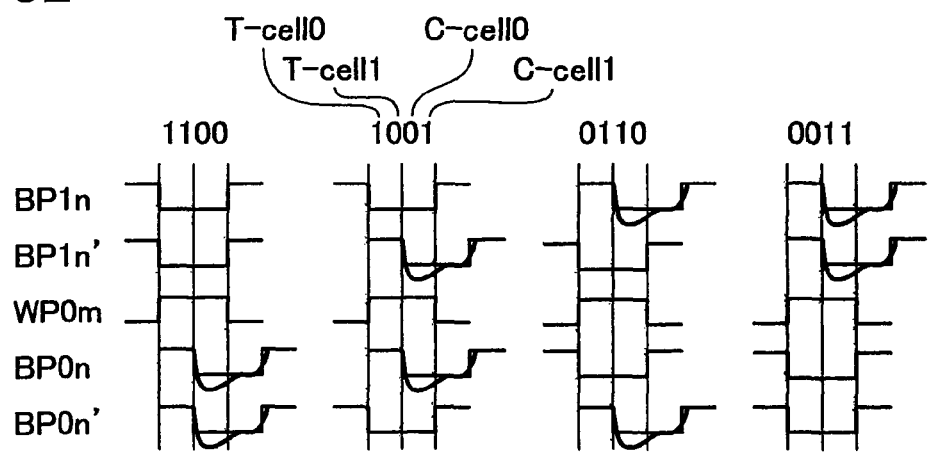
FIG. 32 is a diagram showing write pulse waveforms of simultaneous write of two pair cells by use of the selecting method.
Figure 31:
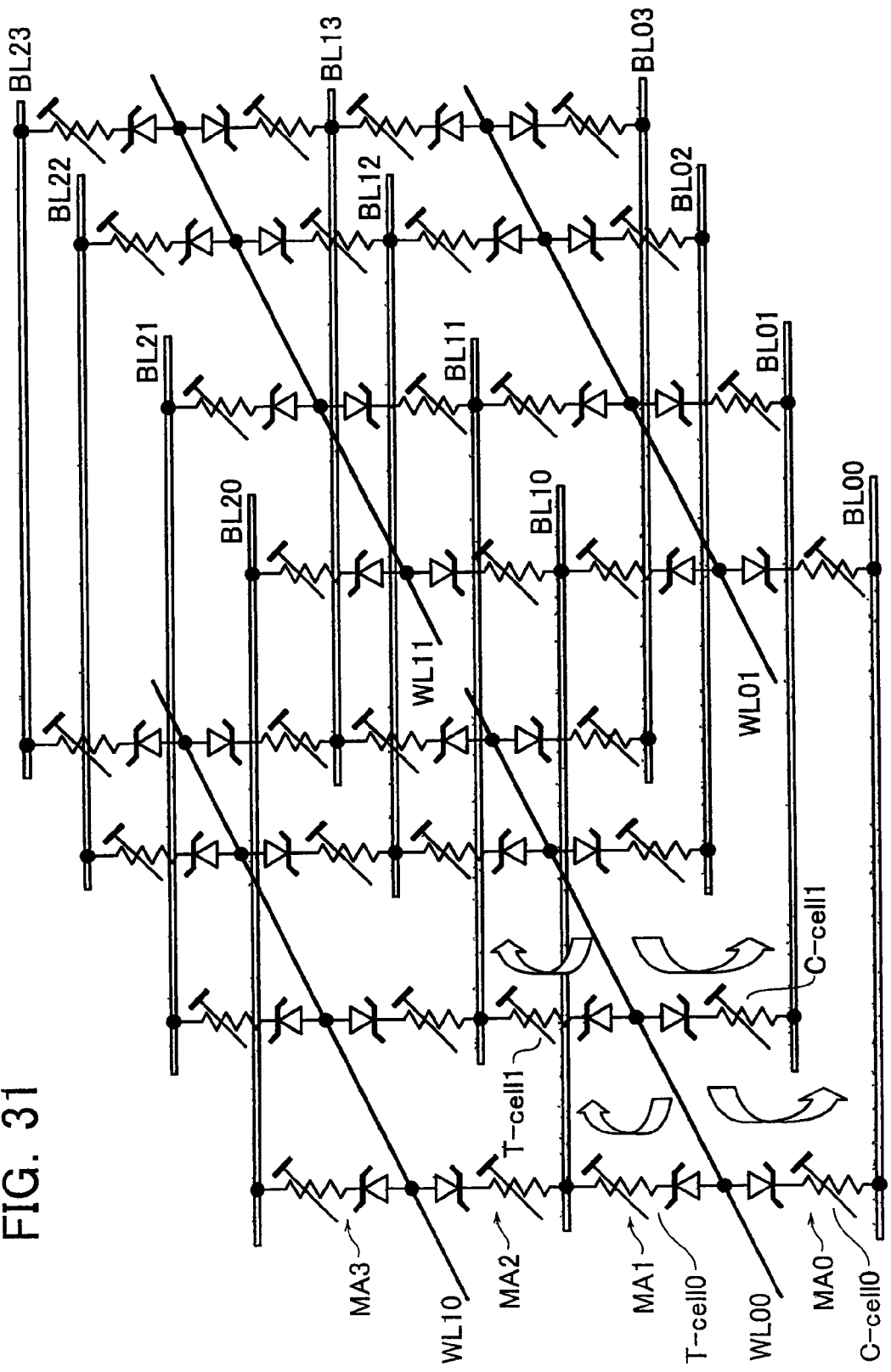
FIG. 31 is a diagram showing a simultaneous write pair-cell selecting method which is different from FIG. 29 in the case of the pair-cell arrangement method of FIG. 19.

Similarly in the case of the pair-cell arranging method shown in FIG. 19 also, similar writing is achievable when performing the simultaneous writing with every couple of layers on the lower side and upper side as a unit rather than the simultaneous writing of serially connected four cells in the lamination direction. In this case, two pair cells T-cell0, C-cell0, T-cell1, C-cell1 within the lower side neighboring cell arrays MA0, MA1 are subjected to simultaneous writing as shown in FIG. 31. Write pulse waveforms at this time are shown in FIG. 32. 0s and 1s which are described atop a waveform are setup data in the order of T-cell0, T-cell1, C-cell0, C-cell1 from the left thereof.

Figure 33:
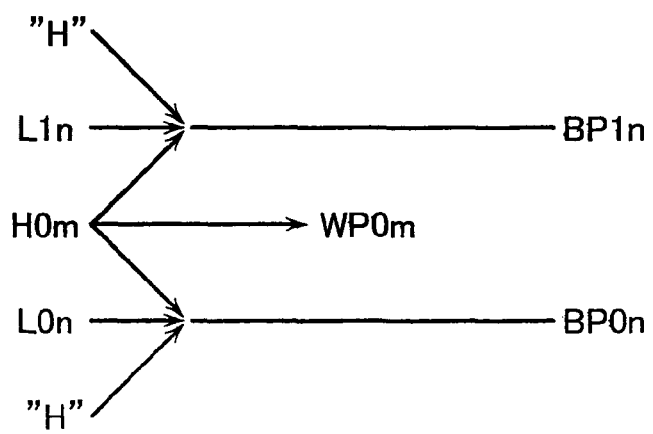
FIG. 33 is a diagram showing a method of generating the write pulse waveforms.

In this case also, the write circuit is permitted to include the negative pulse booster circuit alone, the input/output signal relationship of which is as shown in FIG. 33. The positive logic write pulse H0m is supplied to the wordline-coupled signal line WP0m without passing through any pulse booster circuit. Given to the bitline-coupled signal lines BP0n, BP1n are signals which are obtained by boosting the negative logic write pulses L0n, L1n through the negative pulse booster circuits 72a in accordance with data in the way shown in FIG. 21. In summary, the OR circuit 251a to which the inputs H1, H2 of the negative pulse booster circuit 72a shown in FIG. 26 are input is no longer necessary: what is required here is to potentially fix at "H" either one of the two inputs of the NAND gate to which the negative logic write pulses L0n, L1n enter.

Figure 34:
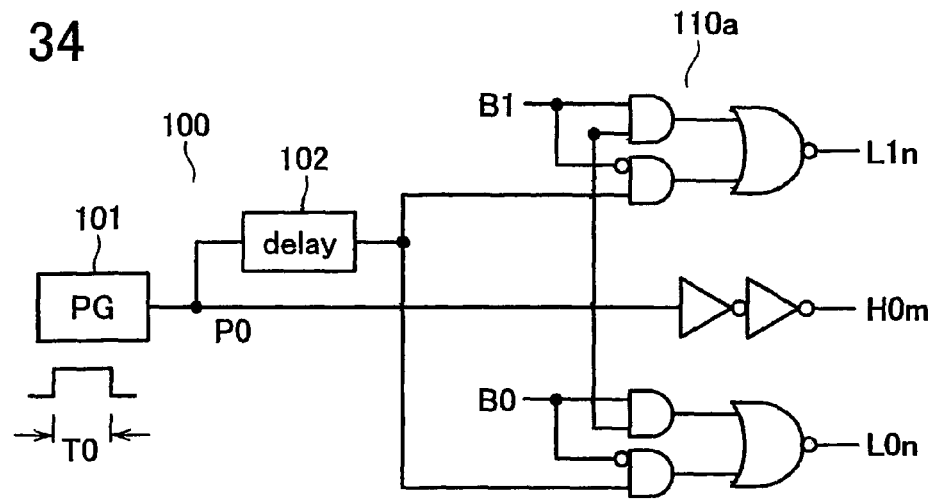
FIG. 34 is a diagram showing a write pulse generator circuit which generates the write pulses.

Additionally in order to generate the input signals of FIG. 33, the write pulse generator circuit 71 in FIG. 21 is arranged as shown in FIG. 34 in such a manner that it is simpler than that of FIG. 24. A pulse generator circuit 100 is the same as that of FIG. 24. An output pulse of the original pulse generator circuit 101 is used as the positive logic write pulse H0m. A logic circuit unit 110a uses the positive logic write pulse H0m as a reference pulse and then combine two pulses as output from a pulse generator circuit 100 in accordance with bit information B0, B1 of the data to be written in a cell to thereby generate the negative logic write pulses L0n, L1n.

It can be said that the arrangement of the write pulse generator circuit 110a of FIG. 34 is the one that generates a positive logic write pulse and a negative logic write pulse with respect to a shared word line of two upper and lower neighboring cell arrays which share word lines and two bit lines which interpose this word line therebetween, respectively. In the case of the writing scheme as has been explained in FIG. 30 also, a similar write pulse generator circuit arrangement will be used although logic data as input thereto are different.

As apparent from the foregoing, in order to read the data written into two pair cells which are set within the stacked cell arrays, if the bit lines that are coupled to these two pair cells are independent of each other, then let the sense amplifier circuits SA shown in FIG. 23 which are provided in a way corresponding to respective pair cells operate simultaneously for readout. However, in the examples shown in FIG. 19, FIG. 20 and FIG. 21, the second layer cell array MA1 and the third layer cell array MA2 share bit lines. In other words, a pair of T-cell0 and C-cell0 and a pair of T-cell1, C-cell1 share the bit line BL1n. With this scheme, it becomes necessary to read the data out of these pair cells in a time-divisional manner.

Figure 35:
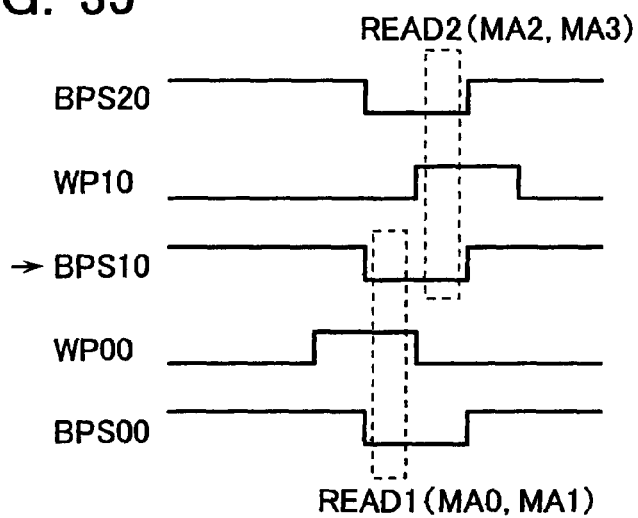
FIG. 35 is a diagram for explanation of a readout method for two bitline-sharing pair-cells.

One time-division reading method is shown in FIG. 35. As shown in FIG. 11, the signal line BP10 is coupled to a bit line BL10 which is in common use for two cell arrays MA1, MA2. As shown in FIG. 23, assume that a common low-potential power supply pulse is supplied to low-potential power supply lines BPS00, BPS10, BPS20 which are for supplying negative logic pulses to the signal lines BP00, BP10, BP20 through resistors during reading. On the contrary, for the signal line WP00 which drives the word line WL0m that is shared by the cell arrays MA0, MA1 and the signal line WP10 which drives the word line WL1m shared by the cell arrays MA2, MA3, positive logic pulses are given in such a way that they are shifted or offset in time from each other and each overlaps a negative logic pulse by the half of its width. Whereby, it is possible to perform readout READ1 with respect to a pair cell which is arranged between the cell arrays MA0, MA1 and readout READ2 relative to a pair cell arranged between the cell arrays MA2, MA3 in a time-divisional manner.

Figure 36:
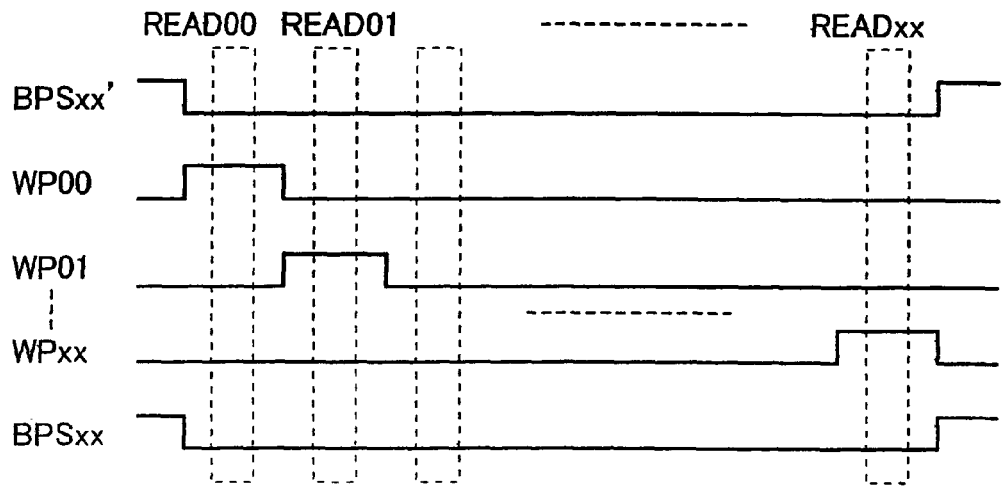
FIG. 36 is a diagram for explanation of a sequential readout method of a plurality of 2-pair cells, which generalizes the above-noted readout method.

FIG. 36 is the one that more generalizes the scheme of FIG. 35. Give a low-potential power supply pulse with a fixed pulse width to low-potential power supply line BPSxx, BPSxx'; and, within a time period equal in length to the pulse width, sequentially give positive logic pulses time-divisionally to the signal lines WP00, WP01, . . . , WPxx for driving the word lines within a cell array. Thus, readouts READ00, READ01, . . . , READxx at overlapping positions of the positive and negative logic pulses are enabled, which in turn makes it possible to time-divisionally read the data of the bitline-shared pair cells.

Figure 37:
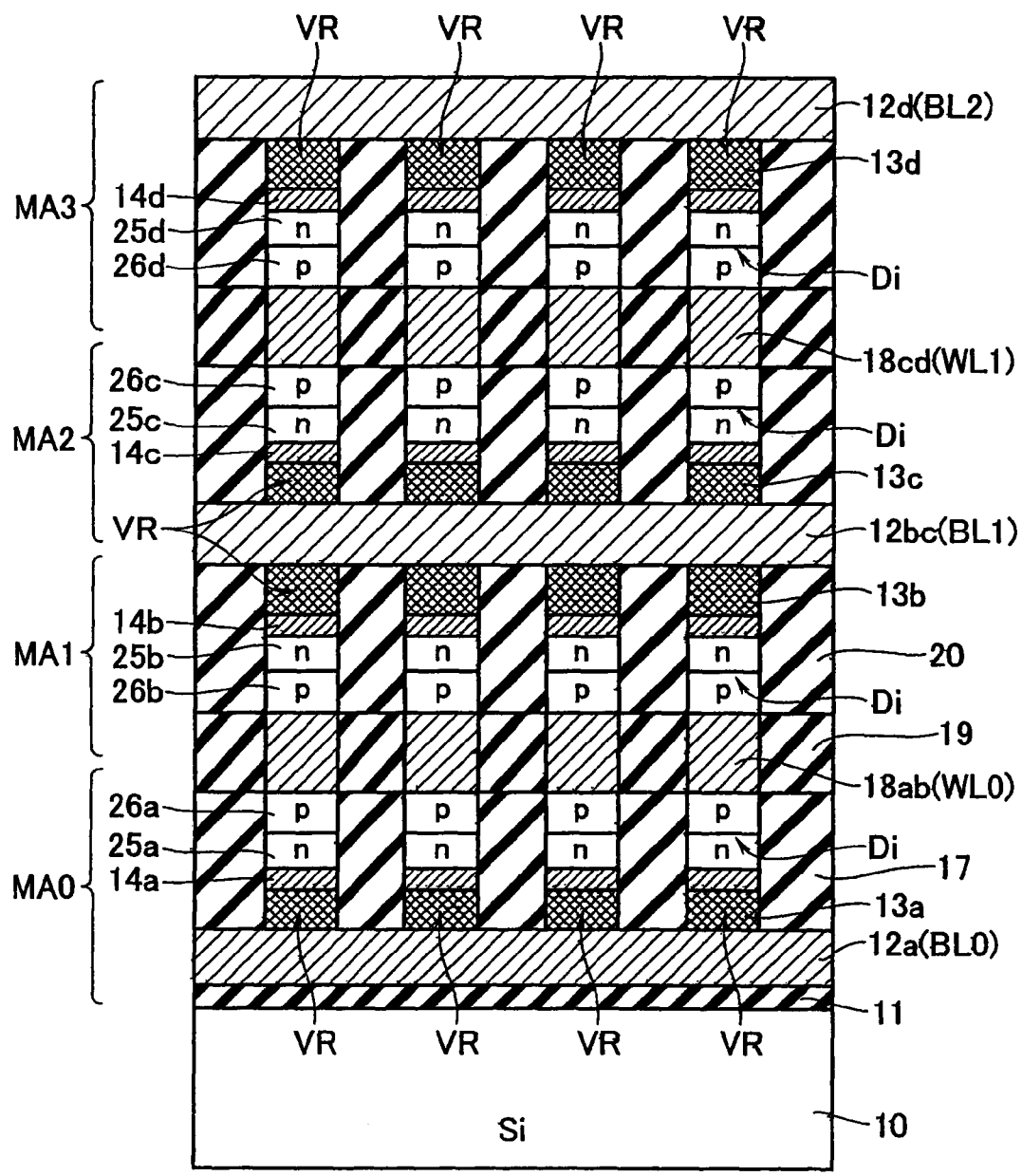
FIG. 37 is a diagram showing a stacked cell array structure which corresponds to FIG. 5 in the case of using PN junction diodes.

Although in the embodiments stated above Schottky diodes are used as the diodes making up the memory cells, it is also possible to use PN junction diodes as described previously. For example, a four-layer cell array structure using PN junction diodes is shown in FIG. 37 in a way corresponding to FIG. 5. At each memory cell which is disposed at a crosspoint or intersection of a bit line and a word line of each layer cell array, a diode D1 is formed which is constituted from a PN junction of an n-type silicon layer 25 and a p-type silicon layer 26. Except this, the structure is the same as that of FIG. 5.

In the above-noted embodiment, the capacitors C1, C2 and diodes D11-D13, D21-D23 in addition to transistor circuitry are used for the write circuit as shown in FIG. 26. It is preferable that such write circuit be formed to have a small occupation area while maximally sharing the cell array region and process. One example is that the diodes D11-D13, D21-D23 of the write circuit are formed simultaneously during formation of the diodes SD used in the cell arrays.

Figure 38:
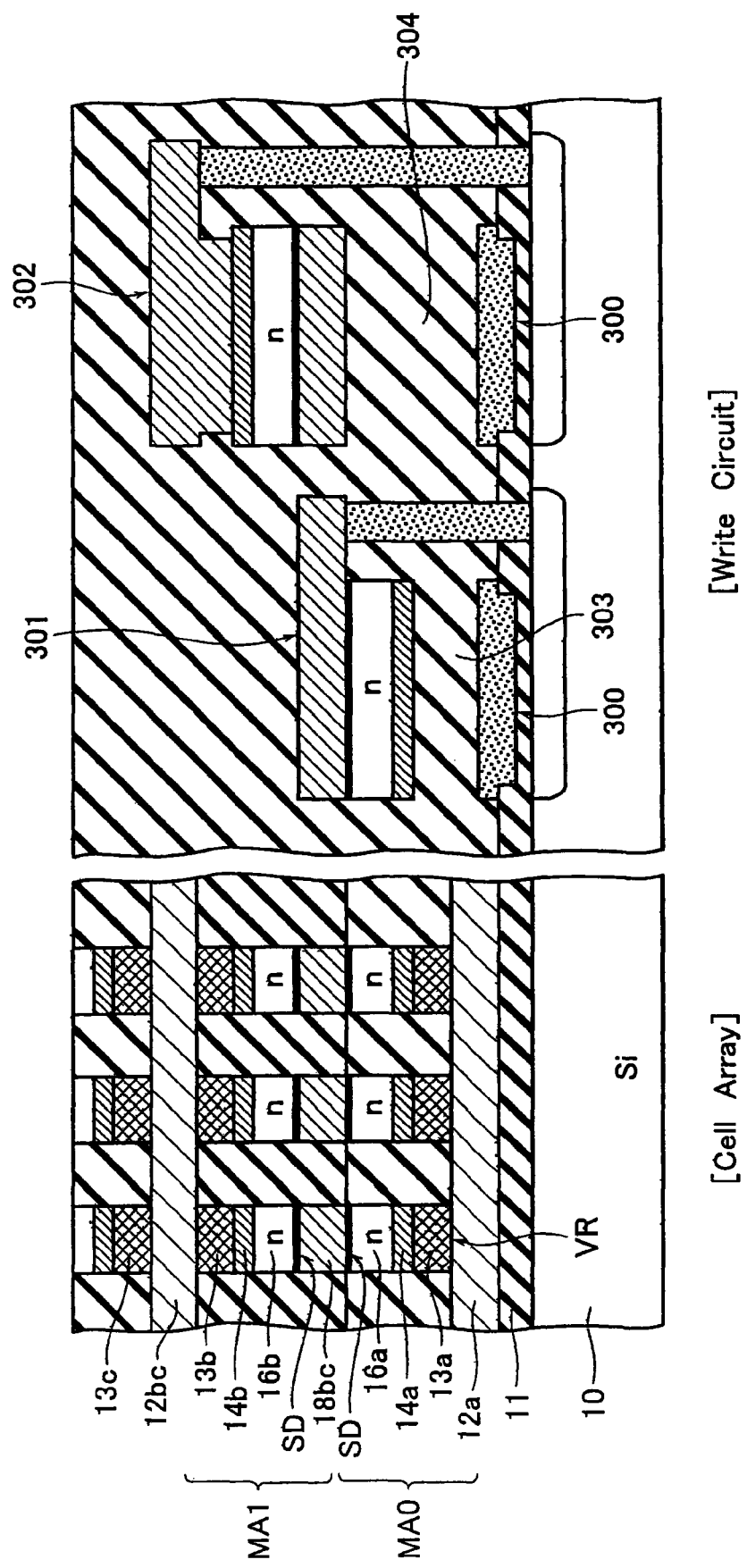
FIG. 38 is a diagram showing an integrated structure of cell arrays and write circuitry operatively associated therewith.

FIG. 38 shows a structure example in the case of sharing the process in such a cell array region and write circuit region. A transistor circuit is formed on the silicon substrate 10 prior to formation of the cell arrays involved. MOS capacitors 300 of FIG. 38 is equivalent to the capacitor C1, C2 shown in FIG. 26. This can be formed simultaneously in the process step of forming peripheral circuit transistors of the silicon substrate 10, prior to fabrication of the cell arrays. Form a diode 301 in such a manner as to overlap this MOS capacitor 300, by simply utilizing the process of forming the diodes SD of the first-layer cell array MA0. Further, form a diode 302 by utilizing the formation process of the diodes SD of second-layer cell array MA1.

In the example of FIG. 38, one diode 301 is connected at an anode to its immediately underlying MOS capacitor 300; another diode 302 is connected at its cathode to a MOS capacitor 300 which is immediately beneath it. A combination of the former diode 301 and capacitor 300 is equivalent to the capacitor C2 on the negative pulse booster circuit 72a side of FIG. 26 and its associative charging diode D22. A combination of the latter diode 302 and capacitor 300 is equivalent to the capacitor C1 on the positive pulse booster circuit 72b side of FIG. 26 and its associative charging diode D12. Similarly, the other diodes in FIG. 26 also can be formed over the MOS capacitor's region simultaneously during fabrication of the diodes of an appropriate layer of each cell array.

It must be noted that in the cell array fabrication process as explained previously, after having formed the multilayer films of from a chalcogenide film up to a semiconductor film, such multilayer films are patterned to form the memory cells. However, when taking into consideration the fabrication process of peripheral circuitry including the write circuit shown in FIG. 38, an additional step is required of removing the chalcogenide film in a peripheral circuit region. Also note that in the structure of FIG. 38, there is required a step of burying interlayer dielectric films 303, 304 between the diodes 301, 302 and the MOS capacitors 300. Optionally it is also possible to leave a metal film used in the cell array region at the portions of these interlayer dielectric films 303, 304.

With the use of the structure such as shown in FIG. 38, it is possible to suppress or minimize the chip occupy area of the write circuit region by stacking or laminating diodes above MOS capacitors, although the MOS capacitors require large areas.

INDUSTRIAL APPLICABILITY

In accordance with this invention, it is possible to provide a phase change memory device capable of performing data read/write operations with large margins while using three-dimensional cell array arrangements.

The invention claimed is:

1. A phase change memory device, comprising:
a substrate;
a plurality of cell arrays stacked above said substrate and each including a matrix layout of a plurality of memory cells, each of said memory cells storing therein as data a resistance value determinable by a phase change;
a write circuit configured to write to a pair cell constituted by two neighboring memory cells within said plurality of cell arrays to write into one cell of said pair cell a high resistance value state and write into the other cell a low resistance value state; and
a read circuit configured to read complementary resistance value states of said pair cell as one bit of data, wherein
each of said cell arrays has a plurality of mutually parallel first wiring lines and a plurality of second wiring lines disposed to cross said first wiring lines while being insulatively isolated from said first wiring lines, and each of said memory cells has a chalcogenide and a diode being stacked at each cross portion of said first wiring lines and said second wiring lines.

2. The phase change memory device according to claim 1, wherein said diode is a Schottky diode formed of a lamination film of a semiconductor film and a metal film.

3. The phase change memory device according to claim 1, wherein upper and lower neighboring cell arrays share at least one group of said first wiring lines and said second wiring lines.

4. The phase change memory device according to claim 1, wherein upper and lower neighboring cell arrays share at least one group of said first wiring lines and said second wiring lines, and said upper and lower neighboring cell arrays are opposite to each other in a lamination order of said chalcogenide and said diode.

5. The phase change memory device according to claim 1, wherein said first wiring lines and second wiring lines are potentially fixed to cause said diode to become reverse-biased during a non-selection, and during a data reading or writing, a first wiring line and a second wiring line which are selected are pulse-driven to permit a diode of a memory cell selected by the first wiring line and the second wiring line to become forward-biased.

6. The phase change memory device according to claim 1, wherein said diode is connected in series to said chalcogenide while having a polarity with a first wiring line side as a cathode and with a second wiring line side as an anode, the phase change memory device further comprising:
a selector circuit for holding said first wiring lines in a higher potential state than said second wiring lines during a non-selection and for supplying a negative logic pulse and a positive logic pulse to a first wiring line and a second wiring line which are selected during a data reading or writing, respectively.

7. The phase change memory device according to claim 1, wherein said pair cell is made up of two upper and lower neighboring memory cells between upper and lower neighboring cell arrays sharing said second wiring lines.

8. The phase change memory device according to claim 1, wherein said pair cell is made up of two neighboring memory cells in each cell array which share one of said second wiring lines and which are connected to different first wiring lines.

9. The phase change memory device according to claim 1, wherein said read circuit has a differential sense amplifier circuit operable to detect a difference of cell current between two memory cells making up said pair cell.

10. The phase change memory device according to claim 3, wherein said write circuit is configured to be operatively associated with a plurality of neighboring memory cells to be selected from said plurality of cell arrays, for supplying a negative logic write pulse to a selected first wiring line and supplying a positive logic write pulse to a selected second wiring line while adjusting an overlap time of the negative logic write pulse and the positive logic write pulse in accordance with data to be written.

11. The phase change memory device according to claim 10, wherein
said write circuit comprises:
a pulse generator circuit configured to generate two types of pulses being the same in a pulse width as each other and having a phase difference therebetween;
a logic gate circuit configured to output a negative logic pulse to one of said first and second wiring lines and a positive logic pulse to the other of said first and second wiring lines with an overlap time thereof determined by a combination logic depending upon write data of the two types of pulses as output from said pulse generator circuit; and
a pulse booster circuit for boosting at least one of said negative logic pulse and said positive logic pulse output from said logic gate circuit when the write data is in a high resistance value state to generate said negative logic write pulse and said positive logic write pulse.

12. The phase change memory device according to claim 1, wherein
said plurality of cell arrays comprise:
a first cell array being formed above said substrate and having
a plurality of mutually parallel first bit lines,
a plurality of memory cells laid out on each first bit line at a prespecified pitch, and
a plurality of first word lines laid out on said memory cells of said first cell array to commonly connect together plural memory cells aligned in a direction crossing said first bit lines;

a second cell array being formed above said first cell array while sharing said first word lines with said first cell array and having
a plurality of memory cells arrayed in the same layout as said first cell array, and
a plurality of second bit lines overlying the memory cells of said second cell array to commonly connect together plural memory cells aligned in a direction crossing said first word lines;

a third cell array being formed above said second cell array while sharing said second bit lines with said second cell array and having
a plurality of memory cells laid out in the same layout as said second cell array, and
a plurality of second word lines overlying the memory cells of said third cell array to commonly connect together plural memory cells aligned in a direction crossing said second bit lines; and a fourth cell array being formed above said third cell array while sharing said second word lines with said third cell array and having
a plurality of memory cells disposed in the same layout as the memory cells of said third cell array, and
a plurality of third bit lines overlying the memory cells of said fourth cell array to commonly connect together plural memory cells aligned in a direction crossing said second word lines.

13. The phase change memory device according to claim 12, wherein a memory cell of each cell array has a chalcogenide and a diode which are stacked at each corresponding cross portion of said first to third bit lines and said first and second word lines.

14. The phase change memory device according to claim 13, wherein said diode of said memory cell of each cell array is a Schottky diode formed of a lamination film of a semiconductor film and a metal film.

15. The phase change memory device according to claim 13, wherein a lamination order of said chalcogenide and said diode of each cell array is inverted between upper and lower neighboring cell arrays, and said diode of each cell array is formed to have a polarity with a side of said first to third bit lines as a cathode.

16. The phase change memory device according to claim 13, wherein every couple of upper and lower neighboring memory cells sharing one of said first word lines between said first cell array and said second cell array constitute a pair cell in which complementary data is stored, and every couple of upper and lower neighboring memory cells sharing one of said second word lines between said third cell array and said fourth cell array constitute a pair cell in which complementary data is stored.

17. The phase change memory device according to claim 13, wherein, in each said first to fourth cell arrays, each two neighboring memory cells sharing said first and second word lines constitute a pair cell in which complementary data is stored.

18. The phase change memory device according to claim 15, further comprising:
a selector circuit configured to hold said first to third bit lines in a lower potential state than said first and second word lines during a non-selection and to supply a negative logic pulse to at least one of said first to third bit lines and to supply a positive logic pulse to at least one of said first and second word lines during a data reading or writing.

19. The phase change memory device according to claim 16, wherein said read circuit comprises a differential sense amplifier circuit with differential input terminals connected to a pair of bit lines which are connected respectively to two memory cells as aligned in a lamination direction of said first to fourth cell arrays to thereby make up each pair cell, said differential sense amplifier circuit being operable to detect a cell current difference of said two memory cells.

20. The phase change memory device according to claim 17, wherein said read circuit comprises a differential sense amplifier circuit with differential input terminals connected to a pair of bit lines which are connected respectively to two memory cells as lined within each of said first to fourth cell arrays to make up each pair cell, said differential sense amplifier configured to detect a cell current difference of the two memory cells.

21. The phase change memory device according to claim 16, wherein said write circuit is configured to simultaneously perform a writing operation with respect to four memory cells making up two pair cells which are aligned in a lamination direction of said first to fourth cell arrays, and
said write circuit comprises:
a pulse generator circuit for generating two kinds of pulses being the same in a pulse width as each other and having a phase difference therebetween;
a logic gate circuit for outputting a negative logic write pulse to said first to third bit lines and a positive logic write pulse to said first and second word lines, said negative logic write pulse and said positive logic write pulse having an overlap time determined by a combination logic of the two kinds of pulses depending upon write data; and
a pulse booster circuit for boosting at least one of said negative logic write pulse and said positive logic write pulse output from said logic gate circuit when the write data is in a high resistance value state.

22. The phase change memory device according to claim 17, wherein said write circuit is configured to perform, in a time divisional manner, a first simultaneous write operation with respect to four memory cells within four pair cells that are constituted within said first to fourth cell arrays respectively, said four memory cells being aligned in a lamination direction for writing a positive logic value, and a second simultaneous write operation with respect to the remaining four memory cells, of the four pair cells, which are aligned in the lamination direction, for writing a negative logic value,
said write circuit comprising:
a pulse generator circuit for generating two kinds of pulses being the same in a pulse width as each other and having a phase difference therebetween;
a logic gate circuit for outputting a negative logic write pulse to said first to third bit lines and a positive logic write pulse to the first and second word lines, said negative logic write pulse and said positive logic write pulse having an overlap time determined by a combination logic of the two kinds of pulses depending upon write data; and
a pulse booster circuit for boosting at least one of said negative logic write pulse and said positive logic write pulse output from said logic gate circuit when the write data is in a high resistance value state.

23. The phase change memory device according to claim 16, wherein said write circuit is configured to perform, in a time divisional manner, a first simultaneous write operation with respect to four memory cells of two pair cells constituted within said first and second cell arrays, each pair cell of said two pair cells constituted within said first and second cell arrays being constituted by two upper and lower neighboring memory cells, said two pair cells constituted within said first and second cell arrays sharing a first word line and being adjacently arranged in a direction of said first word line, and a second simultaneous write operation with respect to four memory cells of two pair cells constituted within said third and fourth cell arrays, each pair cell of said two pair cells constituted within said third and fourth cell arrays being constituted by two upper and lower neighboring memory cells, said two pair cells constituted within said third and fourth cell arrays sharing a second word line and being adjacently arranged in a direction of said second word line, said write circuit comprising:
  a pulse generator circuit for generating two kinds of pulses being the same in a pulse width as each other and having a phase difference therebetween;
  a logic gate circuit for outputting a positive logic write pulse to a shared word line of upper and lower neighboring cell arrays and a negative logic write pulse to two bit lines with said shared word line placed therebetween, said positive logic write pulse and said negative logic write pulse having an overlap time determined by a combination logic of said two kinds of pulses depending upon write data; and
  a pulse booster circuit for boosting in a negative direction said negative logic write pulse to be output from said logic gate circuit when the write data is in a high resistance value state.

24. The phase change memory device according to claim 17, wherein said write circuit is configured to perform, in a time divisional manner, a first simultaneous write operation with respect to four memory cells of two pair cells that are constituted within said first and second cell arrays, respectively, to be upper and lower neighboring, and a second simultaneous write operation with respect to four memory cells of two pair cells that are constituted within said third and fourth cell arrays, respectively, to be upper and lower neighboring, said write circuit comprising:
  a pulse generator circuit for generating two kinds of pulses being the same in a pulse width as each other and having a phase difference therebetween;
  a logic gate circuit for outputting a positive logic write pulse to a shared word line of the upper and lower neighboring first and second cell arrays or the upper and lower neighboring third and fourth cell arrays and a negative logic write pulse to two bit lines with said shared word line interposed therebetween, said positive logic write pulse and said negative logic write pulse having an overlap time determined by a combination logic of said two kinds of pulses depending upon write data; and
  a pulse booster circuit for boosting in a negative direction said negative logic write pulse to be output from said logic gate circuit when the write data is in a high resistance value state.

25. A memory device, comprising a substrate and a plurality of cell arrays stacked above the substrate, a cell array comprising:
  a plurality of first wiring lines formed on an underlying substrate;
  a plurality of second wiring lines formed to cross the first wiring lines, the second wiring lines being insulated from the first wiring lines; and
  memory cells disposed at cross portions of the first and second wiring lines, wherein the memory cells have a stacked structure of a variable resistance element and a diode, and two memory cells constitute a pair cell for storing complementary data, and the first wiring lines and second wiring lines are potentially fixed to cause the memory cells to be reverse-biased during a non-selection, and, during a data reading or writing, a selected first wiring line and a selected second wiring line are pulse-driven to forward-bias the diode.

26. The memory device according to claim 25, wherein the diode is a Schottky diode.

27. The memory device according to claim 25, wherein two adjacent cell arrays share at least one group of the first wiring lines and the second wiring lines.

28. The memory device according to claim 25, wherein two adjacent cell arrays share at least one group of the first wiring lines and the second wiring lines, and the two adjacent cell arrays are opposite to each other in a lamination order of the variable resistance element and the diode.

29. The memory device according to claim 25, wherein the pair cell is made up of two memory cells selected one by one from two adjacent cell arrays sharing the second wiring lines, nodes of the two memory cells being coupled in common to one of the second wiring lines shared by the two adjacent cell arrays while the other nodes of the two memory cells are coupled to different first wiring lines in the two adjacent cell arrays.

30. The memory device according to claim 25, wherein the pair cell is made up of two memory cells selected in the cell array, nodes of the two memory cells being coupled in common to one of the second wiring lines in the cell array while the other nodes of the two memory cells are coupled to different first wiring lines in the cell array.

31. A memory device, comprising:
  a substrate;
  a plurality of cell arrays stacked above the substrate, a cell array including a plurality of memory cells;
  a write circuit configured to write complementary data in a pair cell constituted by two memory cells selected from the cell arrays; and
  a read circuit configured to read the complementary data of the pair cell, wherein the cell array comprises
    a plurality of first wiring lines formed on an underlying substrate, and
    a plurality of second wiring lines formed to cross the first wiring lines, the second wiring lines being insulated from the first wiring lines,
  each memory cell has a variable resistance element and a diode stacked at each cross portion of the first and second wiring lines, the variable resistance element to be set at a resistance value serving as information, and the diode is disposed with such a polarity that a cathode thereof is directed to a first wiring line,
  the memory device further comprising:
    selector circuits configured to hold the first wiring lines in a higher potential state than the second wiring lines during a non-selection and supply a negative logic pulse and a positive logic pulse to a first wiring line and a second wiring line, respectively, which are selected during a data reading or writing.

32. The memory device according to claim 31, wherein the read circuit has a differential sense amplifier circuit operable to detect a cell current difference between two memory cells making up the pair cell.

33. The memory device according to claim 31, wherein the write circuit is configured to be operatively associated with a plurality of neighboring memory cells selected from the cell arrays for supplying a negative logic write pulse and a positive logic write pulse to a selected first wiring line and a selected second wiring line, respectively, while adjusting an overlap time of the negative logic pulse and the positive logic pulse supplied to the selected first wiring line and the selected second wiring line in accordance with data to be written.

34. The memory device according to claim 33, wherein the write circuit comprises:
    a pulse generator circuit configured to generate two types of pulses with a same pulse width as each other and having a phase difference therebetween;
    a logic gate circuit configured to output a negative logic pulse and a positive logic pulse to a selected first wiring line and a selected second wiring line, respectively, with an overlap time thereof determined in accordance with write data by a combination logic of the two types of pulses; and
    a pulse booster circuit for boosting at least one of the negative logic pulse and the positive logic pulse output from the logic gate circuit when the write data is a high resistance value state.

35. A memory device comprising:
    a substrate;
    a plurality of cell arrays stacked above the substrate, a cell array including a plurality of memory cells each having a variable resistance element to be set at a resistance value serving as information;
    a write circuit configured to write complementary data in a pair cell constituted by two memory cells selected from the cell arrays; and
    a read circuit configured to read the complementary data of the pair cell, wherein the plurality of cell arrays includes
        a first cell array formed above the substrate to have
            first bit lines,
            memory cells arrayed on each of the first bit lines, and
            first word lines, laid out on the memory cells of the first cell array to couple the memory cells of the first cell array, aligned in a direction crossing the first bit lines;
        a second cell array formed above the first cell array to have
            the first word lines shared with the first cell array,
            memory cells arrayed on each of the first word lines, and
            second bit lines, laid out on the memory cells of the second cell array to couple the memory cells of the second cell array, aligned in a direction crossing the first word lines;
        a third cell array formed above the second cell array to have
            the second bit lines shared with the second cell array,
            memory cells arrayed on each of the second bit lines, and
            second word lines, laid out on the memory cells of the third cell array to couple the memory cells of the third cell array, aligned in a direction crossing the second bit lines; and
        a fourth cell array formed above the third cell array to have
            the second word lines shared with the third cell array,
            memory cells arrayed on each of the second word lines, and
            third bit lines, laid out on the memory cells of the fourth cell array to couple the memory cells of the fourth cell array, aligned in a direction crossing the second word lines.

36. The memory device according to claim 35, wherein each memory cell in the cell arrays has the variable resistance element and a diode, which are stacked at each cross portion of the first to third bit lines and the first and second word lines.

37. The memory device according to claim 36, wherein the diode is a Schottky diode.

38. The memory device according to claim 36, wherein lamination orders of the variable resistance element and the diode are reversed to each other between two adjacent cell arrays, and the diode is formed to be directed to each of the first to third bit lines.

39. The memory device according to claim 36, wherein every couple of upper and lower neighboring memory cells, which share one of the first word lines shared by the first and second cell arrays, constitute a pair cell, and every couple of upper and lower neighboring memory cells, which share one of the second word lines shared by the third and fourth cell arrays, constitute a pair cell.

40. The memory device according to claim 36, wherein two neighboring memory cells, which are disposed in the cell array to share the first word line or the second word line, constitute a pair cell.

41. The memory device according to claim 36, further comprising:
    selector circuits configured to hold the first to third bit lines in a higher potential state than the first and second word lines during a non-selection and supply a negative logic pulse and a positive logic pulse to at least one of the first to third bit lines and at least one of the first and second word lines, respectively, which are selected during a data reading or writing.

42. The memory device according to claim 36, wherein the read circuit comprises a differential sense amplifier with differential input nodes selectively connected with a pair of bit lines selected one by one from two adjacent cell arrays, two memory cells of a selected pair cell being coupled to the pair of bit lines, the differential sense amplifier being operable to detect a cell current difference of the two memory cells of the selected pair cell.

43. The memory device according to claim 36, wherein the read circuit comprises a differential sense amplifier with differential input nodes selectively connected with a pair of bit lines selected in a selected cell array, two memory cells of a selected pair cell being coupled to the pair of bit lines, the differential sense amplifier being operable to detect a cell current difference of the two memory cells of the selected pair cell.

44. The memory device according to claim 36, wherein the write circuit is configured to simultaneously write to four memory cells constituting two pair cells, which are aligned in a lamination direction of the first to fourth cell arrays, and the write circuit comprises:
    a pulse generator circuit configured to generate two types of pulses with a same pulse width as each other and having a phase difference therebetween;
    a logic gate circuit configured to output a negative logic pulse and a positive logic pulse to a selected first wiring line and a selected second wiring line, respectively, with an overlap time thereof determined in accordance with write data by a combination logic of the two types of pulses; and
    a pulse booster circuit for boosting at least one of the negative logic pulse and the positive logic pulse output from the logic gate circuit when the write data is a high resistance value state.

45. The memory device according to claim 36, wherein the write circuit is configured to perform, in a time divisional manner, a first simultaneous write operation with respect to four memory cells of four pair cells constituted within the first to fourth cell arrays, respectively, the four memory cells being aligned in a lamination direction to be written therein a positive logic value, and a second simultaneous write operation with respect to the remaining four memory cells, of the four pair cells, aligned in the lamination direction to be written therein a negative logic value, the write circuit comprising:

a pulse generator circuit configured to generate two types of pulses with a same pulse width as each other and having a phase difference therebetween:

a logic gate circuit configured to output a negative logic pulse and a positive logic pulse to a selected first wiring line and a selected second wiring line, respectively, with an overlap time thereof determined in accordance with write data by a combination logic of the two types of pulses; and a pulse booster circuit for boosting at least one of the negative logic pulse and the positive logic pulse output from the logic gate circuit when the write data is a high resistance value state.

46. The memory device according to claim 36, wherein the write circuit is configured to perform, in a time divisional manner, a first simultaneous write operation with respect to four memory cells of two pair cells constituted within the first and second cell arrays, each pair cell constituted within the first and second cell arrays being constituted by two upper and lower neighboring memory cells, the two pair cells constituted within the first and second cell arrays sharing a first word line and being adjacently arranged in a direction of the first word line, and a second simultaneous write operation with respect to four memory cells of two pair cells constituted within the third and fourth cell arrays, each pair cell constituted within the third and fourth cell arrays being constituted by two upper and lower neighboring memory cells, the two pair cells constituted within the third and fourth cell arrays sharing a second word line and being adjacently arranged in a direction of the second word line, the write circuit comprising:

a pulse generator circuit configured to generate two types of pulses with a same pulse width as each other and having a phase difference therebetween;

a logic gate circuit configured to output a positive logic pulse and a negative logic pulse to a selected word line shared between two adjacent cell arrays and two selected bit lines sandwiching the selected word line, respectively, with an overlap time thereof determined in accordance with write data by a combination logic of the two types of pulses; and a pulse booster circuit for boosting the negative logic pulse output from the logic gate circuit to a negative direction when the write data is a high resistance value state.

47. The memory device according to claim 36, wherein the write circuit is configured to perform, in a time divisional manner, a first simultaneous write operation with respect to four memory cells of two pair cells constituted within the first and second cell arrays, respectively, and a second simultaneous write operation with respect to four memory cells of two pair cells constituted within the third and fourth cell arrays, respectively, the write circuit comprising:

a pulse generator circuit configured to generate two types of pulses with a same pulse width as each other and having a phase difference therebetween;

a logic gate circuit configured to output a positive logic pulse and a negative logic pulse to a selected word line shared between two adjacent cell arrays and two selected bit lines sandwiching the selected word line, respectively, with an overlap time thereof determined in accordance with write data by a combination logic of the two types of pulses; and a pulse booster circuit for boosting the negative logic pulse output from the logic gate circuit to a negative direction when the write data is a high resistance value state.

* * * * *

UNITED STATES PATENT AND TRADEMARK OFFICE
CERTIFICATE OF CORRECTION

PATENT NO.          : 7,859,885 B2
APPLICATION NO.     : 11/970154
DATED               : December 28, 2010
INVENTOR(S)         : Haruki Toda It is certified that error appears in the above-identified patent and that said Letters Patent is hereby corrected as shown below:

On the title page, Item (75), the inventor's city of residence is incorrect. Item (75) should read:

-- Inventor:    Haruki Toda, Yokohama-shi (JP) --

Signed and Sealed this
Twelfth Day of April, 2011

David J. Kappos
*Director of the United States Patent and Trademark Office*